(12) United States Patent
Georgescu et al.

(10) Patent No.: US 8,139,408 B2
(45) Date of Patent: *Mar. 20, 2012

(54) SCALABLE ELECTRICALLY ERASEABLE AND PROGRAMMABLE MEMORY

(75) Inventors: Sorin S. Georgescu, San Jose, CA (US); Peter Cosmin, San Jose, CA (US); George Smarandoiu, San Jose, CA (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 510 days.

This patent is subject to a terminal disclaimer.

(21) Appl. No.: 12/050,491

(22) Filed: Mar. 18, 2008

(65) Prior Publication Data

US 2008/0165582 A1    Jul. 10, 2008

Related U.S. Application Data

(63) Continuation-in-part of application No. 11/470,245, filed on Sep. 5, 2006, now Pat. No. 7,528,436.

(51) Int. Cl.
*G11C 11/34* (2006.01)

(52) U.S. Cl. .......... 365/185.05; 365/185.01; 365/185.33

(58) Field of Classification Search ............ 365/185.05, 365/185.01, 185.33, 185.28, 218, 185.1, 365/185.26, 185.27

See application file for complete search history.

(56) References Cited

U.S. PATENT DOCUMENTS

| | | | |
|---|---|---|---|
| 5,364,806 A * | 11/1994 | Ma et al. | 438/266 |
| 5,648,669 A | 7/1997 | Sethi et al. | |
| 5,790,455 A | 8/1998 | Caywood | |
| 5,792,670 A | 8/1998 | Pio et al. | |
| 5,862,082 A * | 1/1999 | Dejenfelt et al. | 365/185.33 |
| 5,914,514 A | 6/1999 | Dejenfelt et al. | |
| 5,940,324 A | 8/1999 | Chi et al. | |
| 6,040,216 A | 3/2000 | Sung | |
| 6,081,451 A | 6/2000 | Kalnitsky et al. | |
| 6,107,659 A | 8/2000 | Onakado et al. | |
| 6,177,315 B1 | 1/2001 | Bergemont et al. | |
| 6,274,898 B1 | 8/2001 | Mehta et al. | |
| 6,284,601 B1 | 9/2001 | Hoang | |
| 6,420,754 B2 | 7/2002 | Takahashi et al. | |
| 6,757,196 B1 | 6/2004 | Tsao et al. | |
| 6,835,987 B2 | 12/2004 | Yaegashi | |
| 6,934,192 B2 | 8/2005 | Tailliet et al. | |
| 7,006,381 B2 | 2/2006 | Dormans et al. | |
| 7,106,628 B2 | 9/2006 | Watanabe | |
| 7,148,538 B2 | 12/2006 | Forbes | |
| 7,157,771 B2 | 1/2007 | Forbes | |

(Continued)

FOREIGN PATENT DOCUMENTS

WO    2008030796 A2    3/2008

*Primary Examiner* — Dang Nguyen

(74) *Attorney, Agent, or Firm* — E. Eric Hoffman; Bever, Hoffman & Harms, LLP

(57) ABSTRACT

A non-volatile memory including one or more EEPROM cell pairs. Each EEPROM cell pair includes three transistors and stores two data bits, effectively providing a 1.5 transistor EEPROM cell. An EEPROM cell pair includes a first non-volatile memory transistor, a second non-volatile memory transistor and a source access transistor. The source access transistor includes: a first source region continuous with a source region of the first non-volatile memory transistor; a second source region continuous with a source region of the second non-volatile memory transistor, and a third source region continuous with source regions of other non-volatile memory transistors located in the same row as the EEPROM cell pair.

17 Claims, 26 Drawing Sheets

U.S. PATENT DOCUMENTS

| | | |
|---|---|---|
| 7,274,075 B2 | 9/2007 | Yaegashi |
| 7,414,893 B2 | 8/2008 | La Rosa |
| 7,450,418 B2 | 11/2008 | Liao et al. |
| 7,528,436 B2 | 5/2009 | Georgescu et al. |
| 7,547,944 B2 | 6/2009 | Georgescu et al. |
| 7,590,005 B2 * | 9/2009 | Hsu et al. ............. 365/185.18 |
| 2003/0057474 A1 | 3/2003 | Ma et al. |
| 2003/0127683 A1 | 7/2003 | Yoo et al. |
| 2003/0127684 A1 | 7/2003 | Yoo et al. |
| 2004/0047217 A1 | 3/2004 | Kamiya |
| 2005/0133851 A1 | 6/2005 | Forbes |
| 2005/0145929 A1 | 7/2005 | Wu et al. |
| 2005/0184337 A1 | 8/2005 | Forbes |
| 2005/0265063 A1 | 12/2005 | Forbes |
| 2007/0020852 A1 * | 1/2007 | Umezawa et al. ............ 438/259 |
| 2007/0228451 A1 | 10/2007 | Georgescu et al. |
| 2008/0054336 A1 | 3/2008 | Georgescu et al. |
| 2010/0039859 A1 * | 2/2010 | Mokhlesi et al. ........ 365/185.03 |

* cited by examiner

| OPERATION | BL1 | BL2 | BL3 | WL1 | WL2 | WL3 | WL4 | SS12 | SS34 | N-WELL | P-WELL |
|---|---|---|---|---|---|---|---|---|---|---|---|
| ERASE ROW 1 | FLOAT | FLOAT | FLOAT | 0 | $V_{PP}$ | $V_{PP}$ | $V_{PP}$ | $V_{PP}$ | $V_{PP}$ | $V_{PP}$ | $V_{PP}$ |
| ERASE ROWS 1&3 | FLOAT | FLOAT | FLOAT | 0 | $V_{PP}$ | 0 | $V_{PP}$ | $V_{PP}$ | $V_{PP}$ | $V_{PP}$ | $V_{PP}$ |
| PROGRAM 301 | 0 | $V_{INT}$ | $V_{INT}$ | $V_{PP}$ | 0 | 0 | 0 | 0 | 0 | 0 | 0 |
| PROGRAM 301 & 307 | 0 | $V_{INT}$ | $V_{INT}$ | $V_{PP}$ | 0 | $V_{PP}$ | 0 | 0 | 0 | 0 | 0 |
| PROGRAM 301 & 303 | 0 | $V_{INT}$ | 0 | $V_{PP}$ | 0 | 0 | 0 | 0 | 0 | 0 | 0 |
| READ ROW 1 | $V_{R1}$ | $V_{R1}$ | $V_{R1}$ | $V_{DD}$ | 0 | 0 | 0 | $V_{DD}$ | 0 | $V_{R2}$ | 0 |

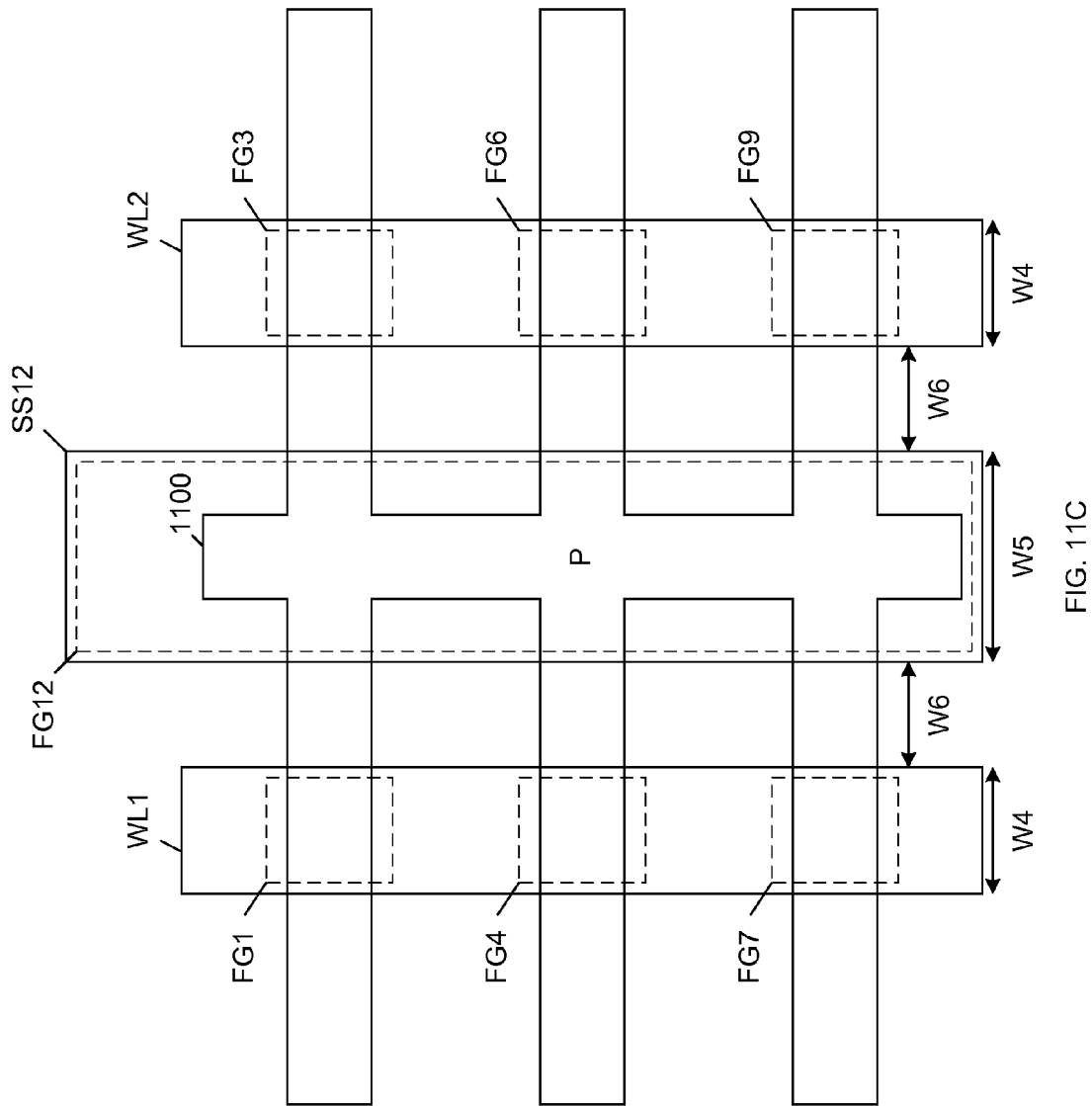

| OPERATION | BL1 | BL2 | BL3 | BLn | WL1 | WL2 | WL3 | WL4 | SS12 | SS34 | N-WELL | P-WELL |
|---|---|---|---|---|---|---|---|---|---|---|---|---|
| ERASE ROW 1 | FLOAT | FLOAT | FLOAT | FLOAT | 0 | $V_{PP}$ | $V_{PP}$ | $V_{PP}$ | $V_{PP}$ | $V_{PP}$ | $V_{PP}$ | $V_{PP}$ |
| ERASE ROWS 1&3 | FLOAT | FLOAT | FLOAT | FLOAT | 0 | $V_{PP}$ | 0 | $V_{PP}$ | $V_{PP}$ | $V_{PP}$ | $V_{PP}$ | $V_{PP}$ |
| PROGRAM 301 | 0 | $V_{INT}$ | $V_{INT}$ | 0 | $V_{PP}$ | 0 | 0 | 0 | 0 | 0 | 0 | 0 |
| PROGRAM 301 & 307 | 0 | $V_{INT}$ | $V_{INT}$ | 0 | $V_{PP}$ | 0 | $V_{PP}$ | 0 | 0 | 0 | 0 | 0 |
| PROGRAM 301 & 303 | 0 | $V_{INT}$ | 0 | 0 | $V_{PP}$ | 0 | 0 | 0 | 0 | 0 | 0 | 0 |
| READ ROW 1 | $V_{R1}$ | $V_{R1}$ | $V_{R1}$ | $V_{R2}$ | $V_{DD}$ | 0 | 0 | 0 | $V_{DD}$ | 0 | 0 | 0 |

SCALABLE ELECTRICALLY ERASEABLE AND PROGRAMMABLE MEMORY

RELATED APPLICATION

The present application is a continuation-in-part of U.S. patent application Ser. No. 11/470,245 filed Sep. 5, 2006.

FIELD OF THE INVENTION

The present invention relates to electrically erasable and programmable memory (EEPROM) cells.

RELATED ART

FIG. 1 is a circuit diagram illustrating a conventional memory system 100 that includes a 2×2 array of electrically erasable and programmable memory (EEPROM) cells 101-104. EEPROM cells 101-104 include CMOS access transistors 111-114, respectively, and non-volatile memory (NVM) transistors 121-124, respectively. The drains of access transistors 111 and 113 are coupled to drain (bit line) terminal D1. Similarly, the drains of access transistors 112 and 114 are coupled to drain (bit line) terminal D2. The sources of access transistors 111-114 are coupled to the drains of NVM transistors 121-124, respectively. The sources of NVM transistors 121-124 are commonly coupled to source terminal S12. The select gates of access transistors 111-112 are commonly connected to select line SL1, and the select gates of access transistors 113-114 are commonly connected to select line SL2. The control gates of NVM transistors 121-122 are commonly connected to control line CL1, and the control gates of NVM transistors 123-124 are commonly connected to control line CL2.

FIG. 2 is a cross sectional view of EEPROM cell 101 and peripheral transistors 201 and 202. Peripheral transistors 201-202 are located on the same chip as EEPROM cells 101-104, and are typically used to access these EEPROM cells. Peripheral transistor 201 includes a source 211, a drain 212, a control gate 210, and a gate dielectric layer 213. Gate dielectric layer 213 has a first thickness T1, which is selected in view of a first voltage used to control the peripheral circuitry. For example, thickness T1 can be 75 Angstroms or less, depending on the process. Similarly, peripheral transistor 202 includes a source 221, a drain 222, a control gate 220, and a gate dielectric layer 223. Gate dielectric layer 223 has a second thickness T2, which is selected in view of a second voltage used to control the peripheral circuitry. For example, thickness T2 can be 300 Angstroms to handle a control voltage of 15 Volts.

Access transistor 111 includes a gate dielectric layer 231 having the second thickness T2. A select gate SG1 is located over this gate dielectric layer 231. NVM transistor 121 includes a gate dielectric layer 232, most of which has a thickness close to the second thickness T2. Dielectric layer 232 includes a thin dielectric tunneling region 233, which has a third thickness T3 of about 100 Angstroms. A floating gate FG1, which stores charge, is located over gate dielectric layer 232 (including tunneling dielectric region 233). The tunneling dielectric region 233 is located over a highly doped N+ region 235, which is an extension of the n-type source/drain diffusion shared by access transistor 111 and NVM transistor 121. An inter-poly dielectric layer 234, having a thickness T4, is located over floating gate FG1. A control gate CG1 is located over the inter-poly dielectric layer 234. The thickness T4 of gate dielectric layer 234 is selected in view of the voltages used to control NVM transistor 121. For example, the dielectric layer 234 can be a composite dielectric (oxide-nitride-oxide) with an equivalent silicon dioxide thickness of about 200 Angstroms to handle programming voltages of about 15 Volts. EEPROM cells 102-104 are identical to EEPROM cell 101.

In order to erase EEPROM cells 101 and 102, a high programming voltage VPP (on the order of about 15 Volts) is applied to the control line CL1 and the select line SL1. The drain terminals D1-D2 and the source terminal S12 are grounded. Under these conditions, the floating gates of NVM transistors 121-122 are coupled to a fraction of the programming voltage VPP, which is enough to produce tunneling currents from the underlying diffusion extension region 235 through the thin gate dielectric region 233. Consequently, the tunneling currents in NVM transistors 121-122, will cause excess electrons to be trapped in the floating gates of these NVM transistors. These trapped electrons increase the threshold voltages of NVM transistors 121-122 (i.e., erase NVM transistors 121-122). EEPROM cells 101-102 can be erased independently of EEPROM cells 103-104. Alternately, EEPROM cells 103-104 can be erased at the same time as EEPROM cells 101-102.

In order to program EEPROM cell 101, the high programming voltage VPP (15 Volts), is applied to the drain terminal D1 and to select line SL1. The control line CL1 and the select line SL2 are grounded. The source terminal S12 and drain D2 are left floating. Under these conditions, access transistor 111 is turned on, and the high programming voltage VPP is applied to the drain extension region 235 of NVM transistor 121. The high voltage across the thin gate dielectric region 233 causes electrons to be removed from the floating gate FG1, thereby causing this transistor to have a relatively low threshold voltage.

The drain of access transistor 111 must have a relatively large active region around the contact in order to properly receive the high programming voltage VPP. In addition, the select gate SG1 of access transistor 111 must be relatively large in order to properly receive the high programming voltage VPP. As a result, access transistor 111 cannot be scaled for processes with feature size of less than 0.35 microns. Similarly, the memory transistor 121 has a large gate area, to accommodate the drain extension diffusion region 235 under the tunneling dielectric region 233. The same limitations apply to access transistors 112-114 and memory transistors 122-124, respectively. It would therefore be desirable to have an EEPROM system that can be scaled to sub-0.35 micron processes.

A few solutions have been presented to extend the applicability of EEPROM-type memories to processes beyond a 0.35 micron process. These solutions permit the shrinking of EEPROM cells by reducing the bitline programming voltage VPP from about 15 to 20 Volts to about 5 Volts. However, these solutions exhibit a number of important drawbacks, including: (i) the memory operation is very complicated, in one case requiring both positive and negative voltages to be applied to the array, (ii) the processes necessary to fabricate these EEPROM memories are also very complicated, thus being prone to difficult yield management, and (iii) the EEPROM cell size is still relatively large and cannot justify the costlier process required to fabricate the array.

Accordingly, it would be desirable to have an improved EEPROM array that overcomes the above-described deficiencies.

BRIEF DESCRIPTION OF THE DRAWINGS

FIGS. 11A-11E are top layout views of the first two rows of the EEPROM array of FIG. 9 during various stages of fabrication, in accordance with one embodiment of the present invention.

FIG. 13 is a table that summarizes erase, program and read operations of the EEPROM array of FIG. 12 in accordance with one embodiment of the present invention.

DETAILED DESCRIPTION

Figure 1:
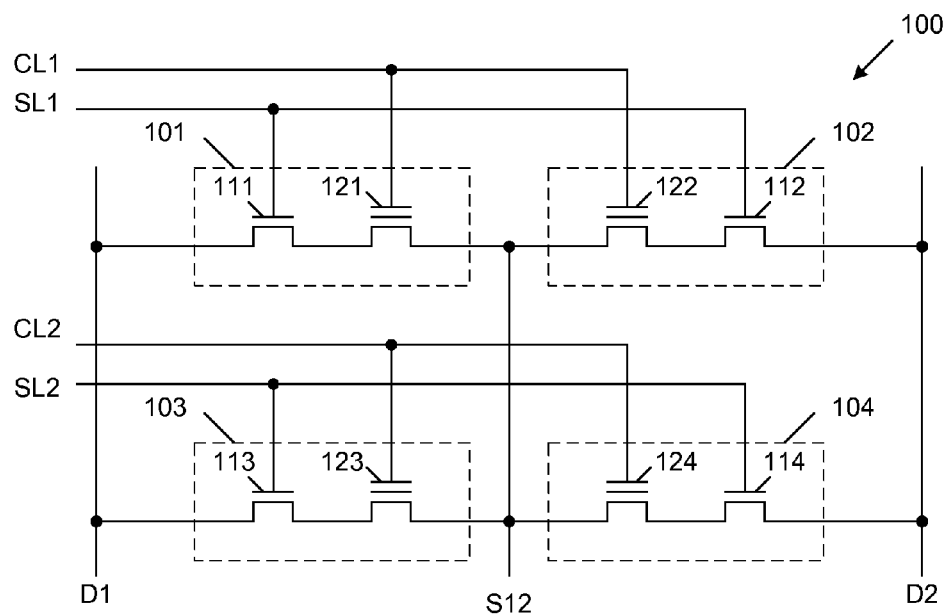
FIG. 1 is a circuit diagram illustrating a conventional memory system that includes an array of electrically erasable and programmable memory (EEPROM) cells.
Figure 2:
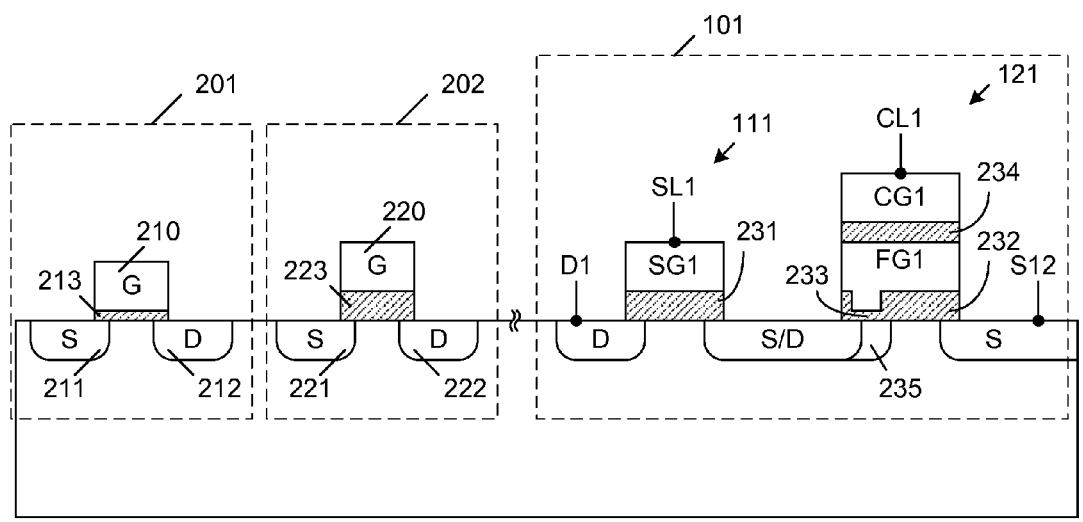
FIG. 2 is a cross sectional view, along the bit line, of two adjacent EEPROM cells of FIG. 1, according to a preferred embodiment.
Figure 3:
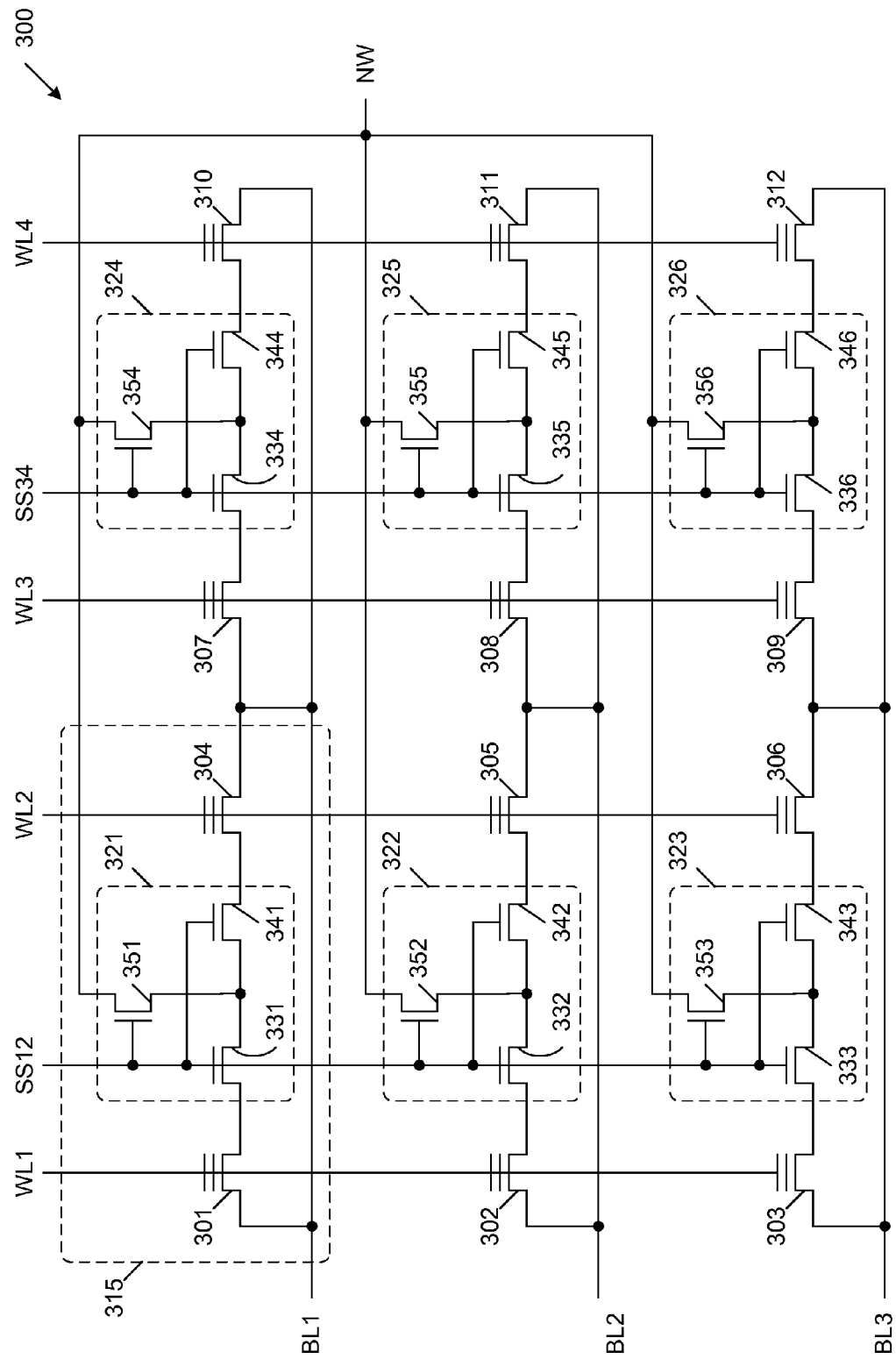
FIG. 3 is a circuit diagram of an array of EEPROM cells in accordance with one embodiment of the present invention.

FIG. 3 is a circuit diagram of an array 300 of EEPROM cells in accordance with one embodiment of the present invention. EEPROM cell array 300 includes floating gate non-volatile memory transistors 301-312, source access transistors 321-326, word lines WL1-WL4, bit lines BL1-BL3, source select lines SS12 and SS34 and N-well connection NW. Source access transistors 321-326 include transistor structures 331-336, respectively, transistor structures 341-346, respectively, and transistor structures 351-356, respectively. As described in more detail below, each of source access transistors 321-326 implements the functionality of three transistor structures using a single transistor.

Memory transistors 301-312 and source access transistors 321-326 are fabricated in a well region having a first conductivity type, which in turn, is located in a well region having a second conductivity type, opposite the first conductivity type. In the described embodiments, memory transistors 301-312 and source access transistors 321-326 are n-channel devices, such that the first well region is a p-well, and the second well region is a deep n-well. However, it us understood that the conductivity types can be reversed in other embodiments. As described in more detail below, transistor structures 351-356 within source access transistors 321-326 are created by forming N+ regions that extend through the p-well region to contact the underlying deep n-well region.

Each of the memory transistors 301-312 belongs to a corresponding EEPROM cell. Thus, array 300 includes twelve EEPROM cells arranged in four rows and three columns. Note that the four rows (corresponding with word lines WL1-WL4) extend along the vertical axis of FIG. 3, while the three rows (corresponding with bit lines BL1-BL3) extend along the horizontal axis of FIG. 3. Although array 300 has four rows and three columns, one of ordinary skill in the art would be able to construct arrays having different dimensions in view of the present disclosure.

Each of the EEPROM cells in array 300 includes a dedicated non-volatile memory transistor and a source access transistor, which is shared with the non-volatile memory transistor of an adjacent EEPROM cell in the same column. In this manner, the EEPROM cells in array 300 are grouped in pairs along the column direction. For example, EEPROM cell pair 315 includes source access transistor 321 and memory transistors 301 and 304. The EEPROM cell located at the first row, first column of array 300 therefore includes memory transistor 301 and source access transistor 321, while the EEPROM cell located at the second row, first column of array 300 includes memory transistor 304 and source access transistor 321. Memory transistor 301 includes a drain coupled to bit line BL1, a control gate coupled to word line WL1, and a source coupled to transistor structure 331 of source access transistor 321. Memory transistor 304 includes a drain coupled to bit line BL1, a control gate coupled to word line WL2, and a source coupled to transistor structure 341 of source access transistor 321. Note that source access transistor 321 is shared by memory transistors 301 and 304. Because memory transistors 301 and 304 share source access transistor 321, each of the EEPROM cells effectively requires 1.5 transistors. Stated another way, EEPROM cell pair 315 stores two bits of data (one bit in each of memory transistors 301 and 304), using three transistors (memory transistors 301 and 304 and source access transistor 321). Thus, on average EEPROM cell pair 315 requires 1.5 transistors to store each bit (i.e., 3 transistors/2 bits). The present invention may therefore be referred to as a 1.5 transistor (1.5 T) EEPROM.

Source access transistor 321 is also coupled to an underlying deep N-well region NW by transistor structure 351. As described in more detail below, the underlying deep N-well region serves as a common array source for the EEPROM cells of array 300.

Figure 4:
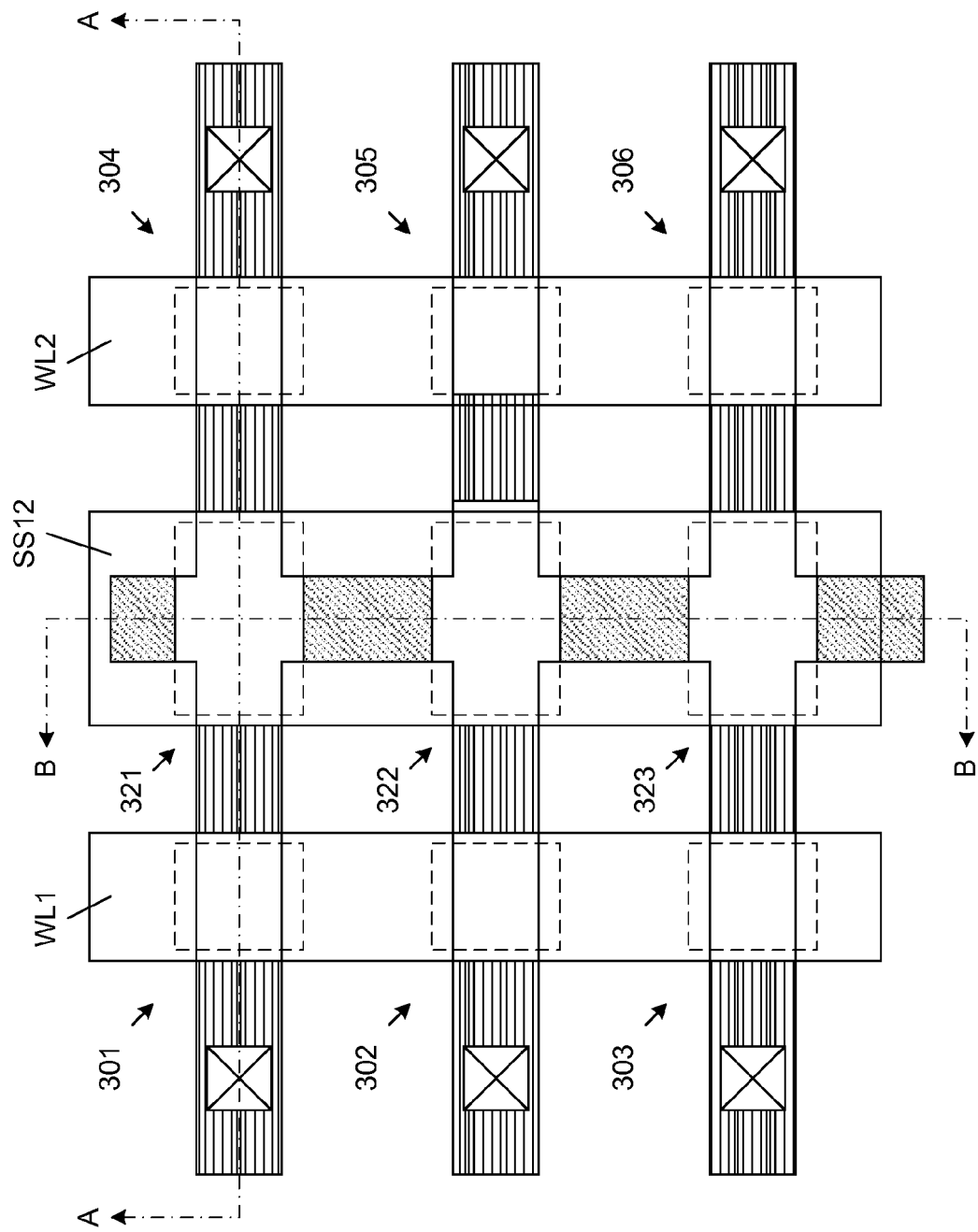
FIG. 4 is a top layout view of the first two rows of the EEPROM array of FIG. 3 in accordance with one embodiment of the present invention.
Figure 5A:
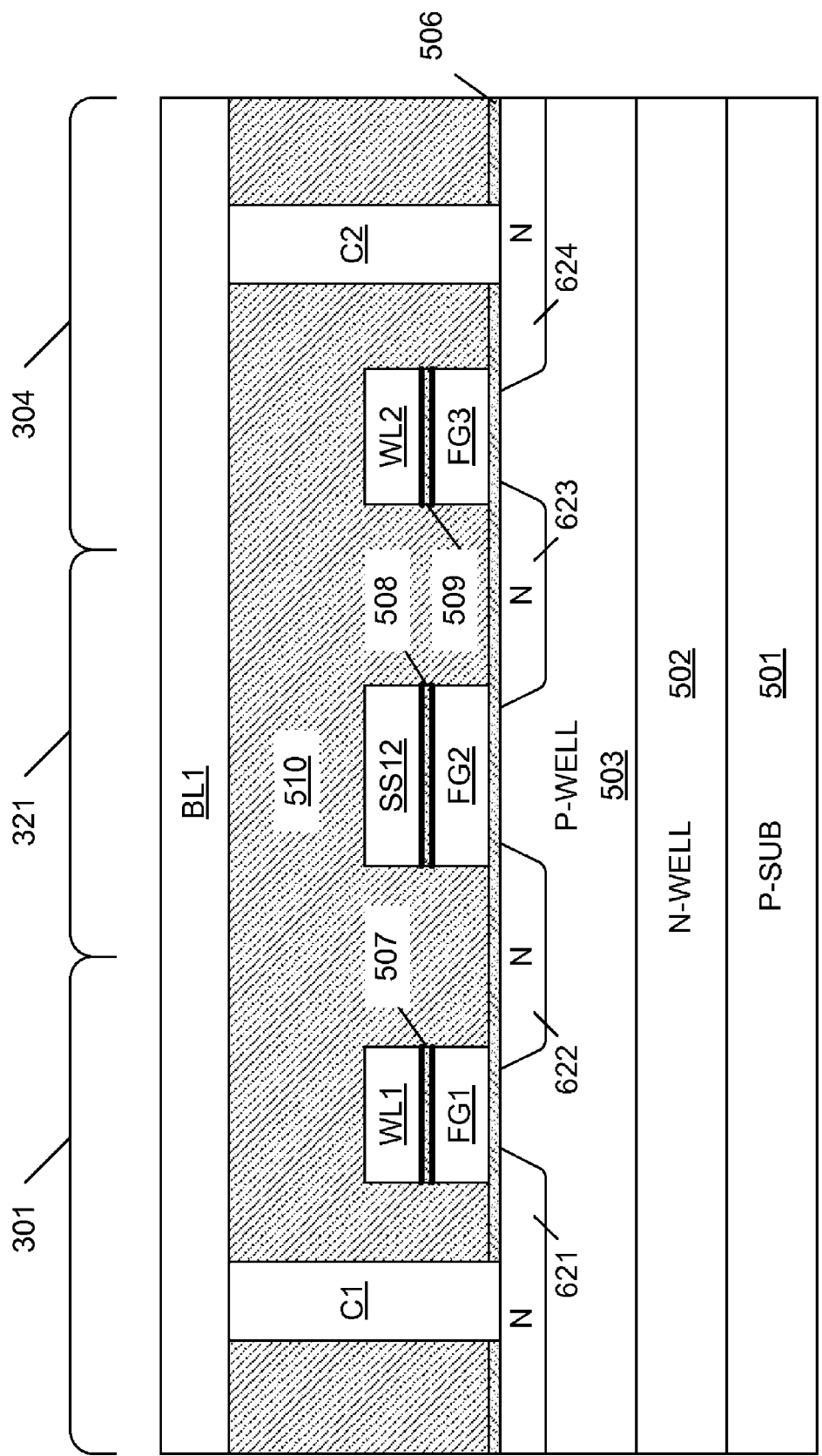
FIG. 5A is a cross-sectional view of an EEPROM cell pair along section line A-A of FIG. 4.

FIG. 4 is a top layout view of the first two rows of array 300, including memory transistors 301-306, source access transistors 321-323, word lines WL1-WL2 and source select line SS12, in accordance with one embodiment of the present invention. The last two rows of array 300 are laid out in the same manner as the first two rows of array 300. Bit lines BL1-BL3 are not shown in FIG. 4 for purposes of clarity (although bit line BL1 is illustrated in FIG. 5A). Additional reference numbers identifying the various regions of FIG. 4 are illustrated in FIGS. 5A-5B and 6A-6G.

Figure 5B:
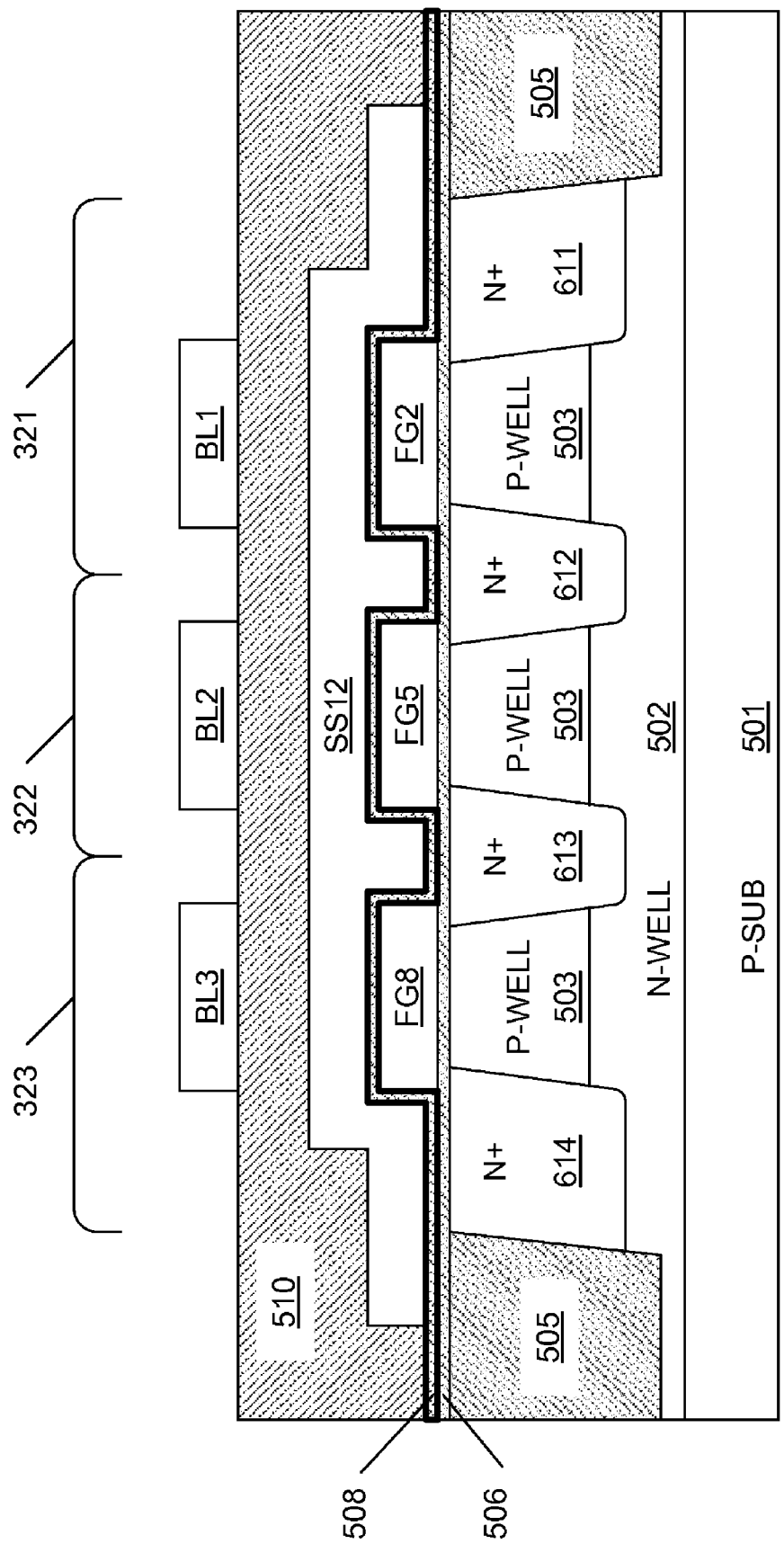
FIG. 5B is a cross-sectional view of three source access transistors along section line B-B of FIG. 4.

FIG. 5A is a cross-sectional view of EEPROM cell pair 315 along section line A-A of FIG. 4. FIG. 5B is a cross-sectional view of source access transistors 321-323 along section line B-B of FIG. 4.

As shown in FIGS. 5A and 5B, EEPROM array 300 is fabricated in p-well region 503. P-well region 503, in turn, is fabricated in deep N-well region 502. Deep N-well region 502 is fabricated in p-type substrate 501. FIG. 5B further illustrates shallow trench isolation regions 505, which isolate EEPROM array 300 from other circuits fabricated on the same substrate 501.

Turning now to FIG. 5A, memory transistor 301 includes n-type drain region 621, n-type source region 622, tunnel gate dielectric layer 506, floating gate FG1, inter-gate dielectric layer 507 and word line (control gate) WL1. Similarly, memory transistor 304 includes n-type drain region 624, n-type source region 623, tunnel gate dielectric layer 506, floating gate FG3, inter-gate dielectric layer 509 and word line (control gate) WL2. Contacts C1 and C2 extend through pre-metal dielectric layer 510 and contact n-type drain regions 621 and 624. Bit line BL1 is formed over pre-metal dielectric layer 510, and provides a conductive path between contacts C1 and C2.

Source access transistor 321 includes tunnel gate dielectric layer 506, floating gate FG2, inter-gate dielectric layer 508 and source select line SS12. Source access transistor 321 also shares n-type source regions 622 and 623 with memory transistors 301 and 304, respectively. In the described embodiments, inter-gate dielectric layers 507-509 are oxide-nitride-oxide (ONO) structures, although other dielectric materials can be used in other embodiments.

As illustrated in FIG. 5B, source access transistor 321 also includes N+ type finger regions 611-612, which are aligned with floating gate FG2, and extend down through p-well region 503 to contact n-well region 502. Similarly, source access transistors 322 includes N+ type finger regions 612-613, which are aligned with floating gate FG5; and source access transistor 323 includes N+ finger regions 613-614, which are aligned with floating gate FG8. P-well region 503 is connected to metal contacts (not shown) in a few locations of array 300, to preserve memory area.

FIGS. 6A-6G are top views of memory transistors 301-306 and source access transistors 321-323 during various stages of fabrication, in accordance with one embodiment of the present invention.

Figure 6A:
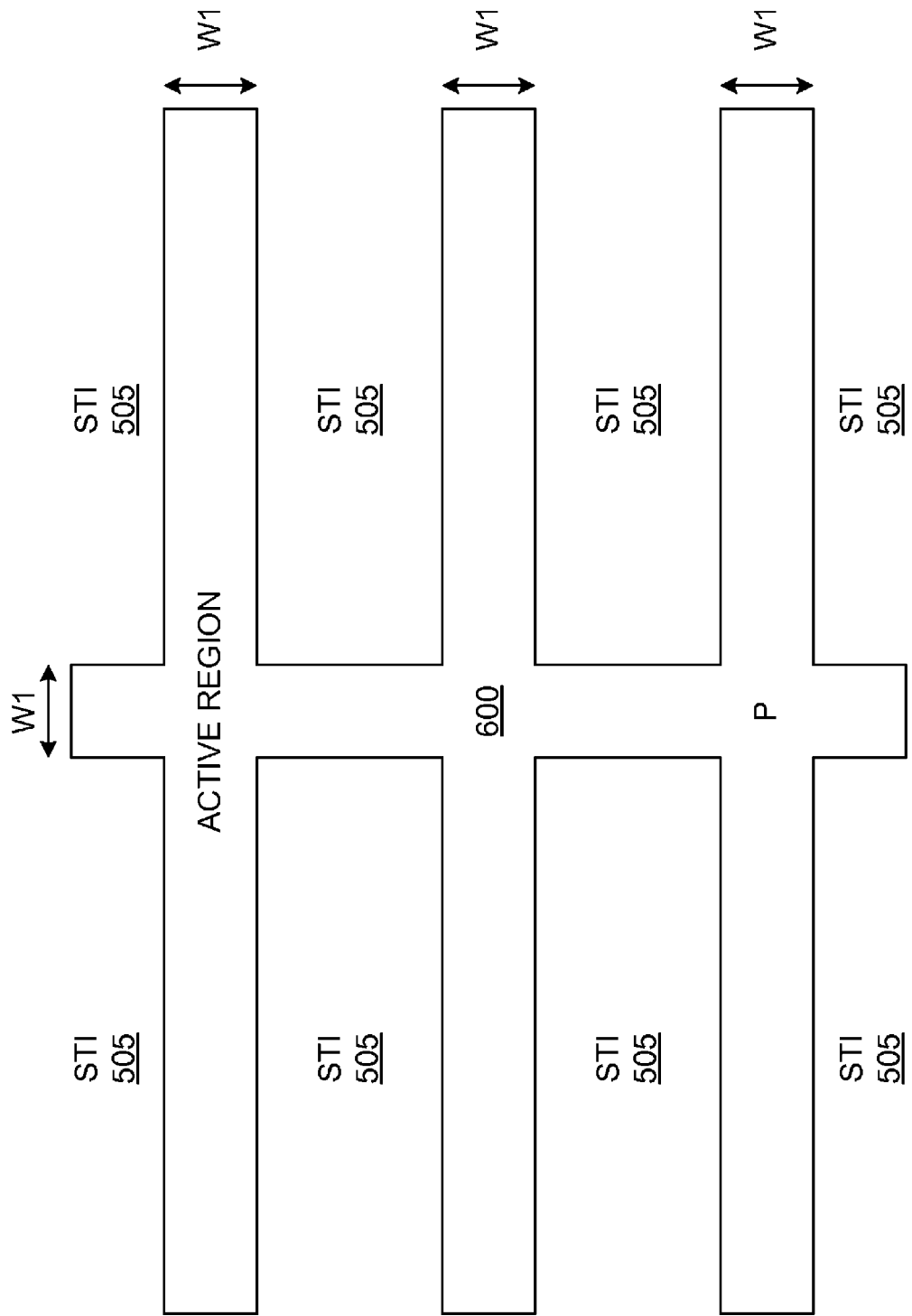
FIGS. 6A-6G are top layout views of the first two rows of the EEPROM array of FIG. 3 during various stages of fabrication, in accordance with one embodiment of the present invention.

As illustrated in FIG. 6A, shallow trench isolation (STI) region 505 is formed on the upper surface of substrate 501, thereby defining the active region 600 where transistors 301-306 and 321-323 will be formed. At this time, deep n-well region 502 has already been formed. P-well region 503 can be formed either before or after STI region 505 is formed. In accordance with the described embodiment, transistors 301-306 and 321-323 are fabricated using a 0.25 micron process. In this embodiment, active region 600 exhibits a dimension W1 of 0.25 microns. Note that array 300 can be fabricated using other processes and other dimensions in other embodiments. Also note that the active region associated with the second two rows of array 300, if illustrated, would be continuous with active region 600.

Figure 6B:
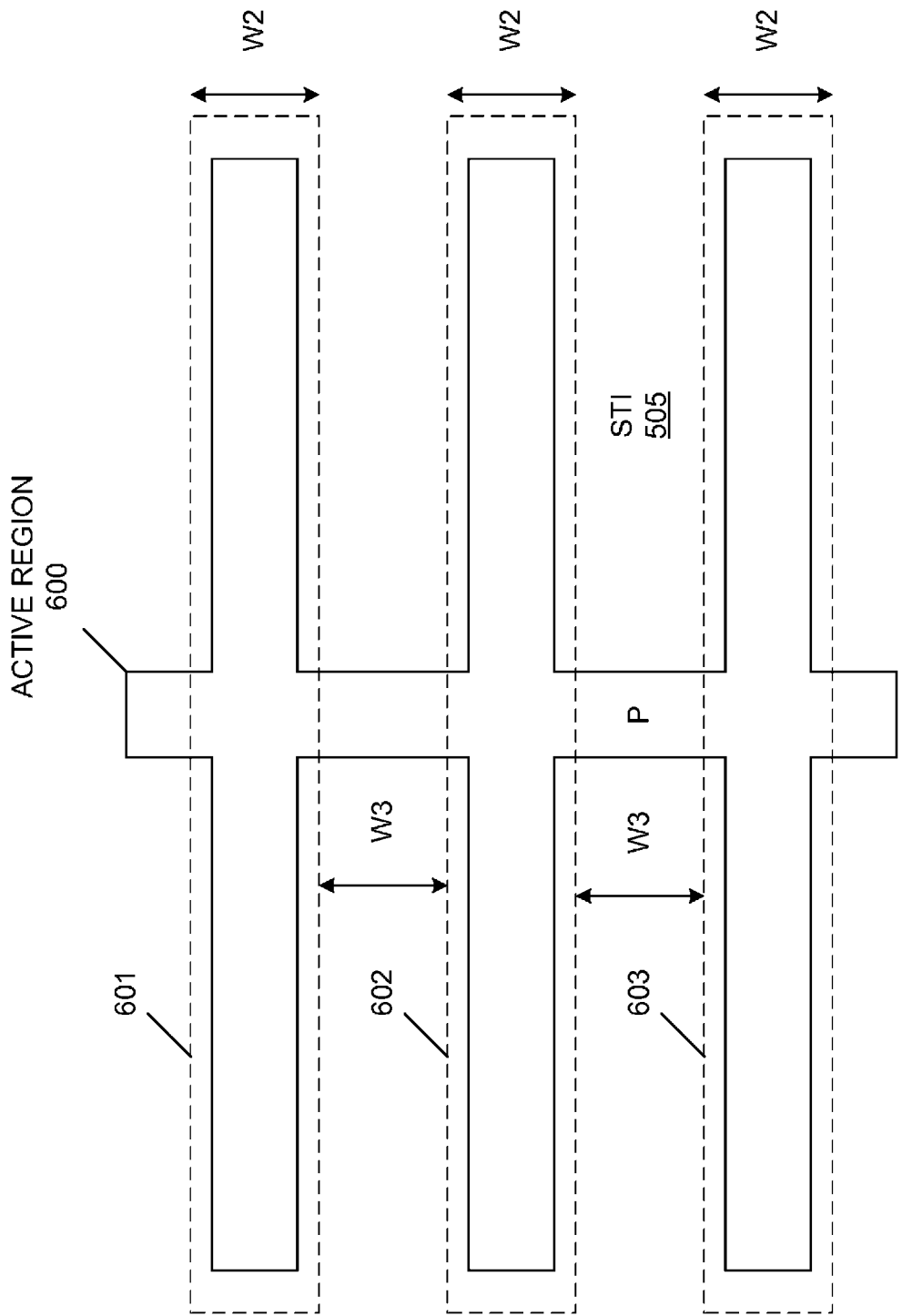

After active region 600 has been defined, tunnel gate dielectric layer 506 is formed over the exposed surface of p-well region 503. For example, tunnel gate dielectric layer 506 may have a thickness between about 70 Angstroms (A) and 100 A. A first layer of polysilicon is formed over the resulting structure. This polysilicon layer is then patterned through a first polysilicon mask to form polysilicon gate electrodes 601-603, as shown in FIG. 6B. In the described embodiment, each of polysilicon gate electrodes 601-603 exhibits a width W2 of about 0.4 microns, and a spacing W3 of about 0.25 microns.

Figure 6C:
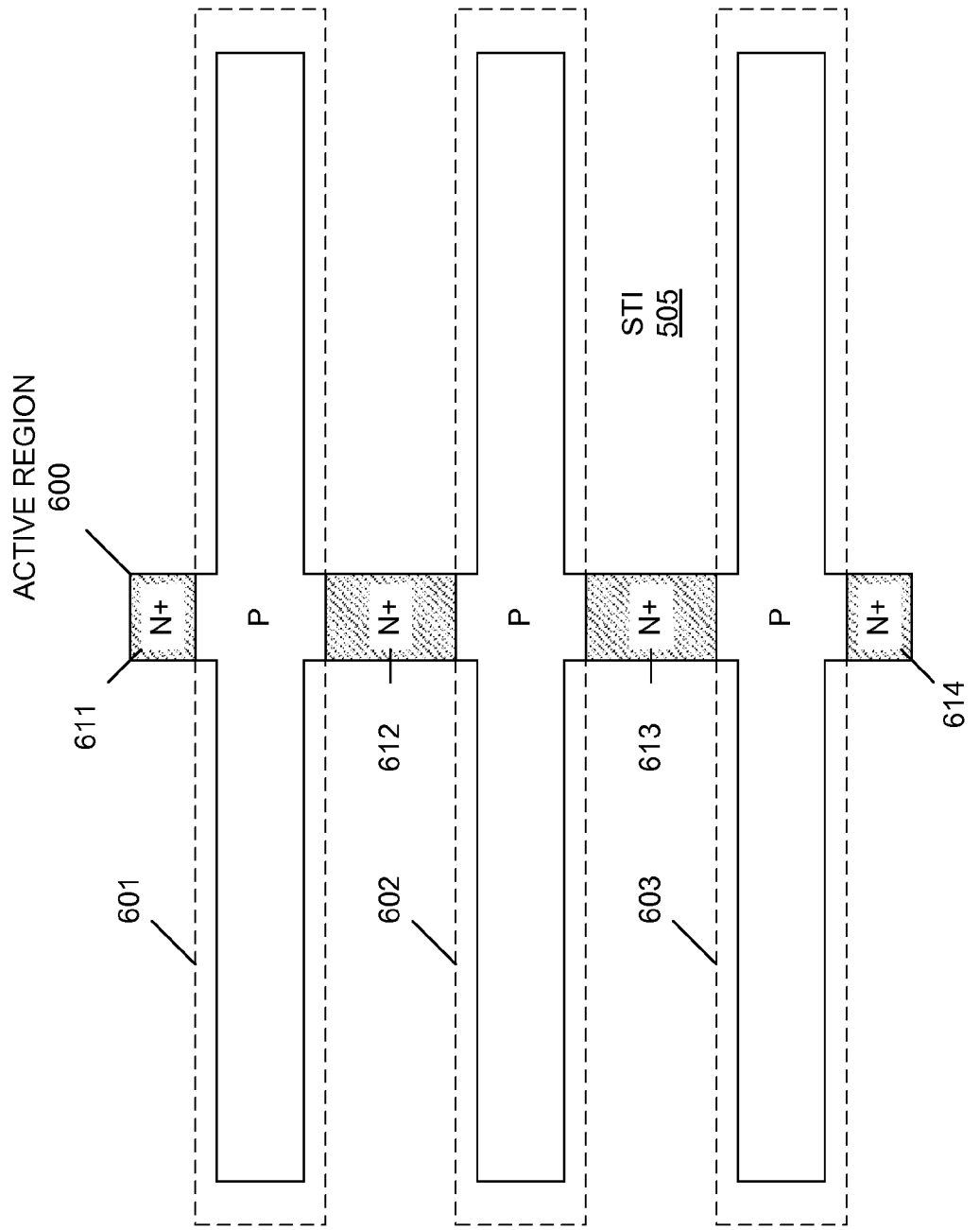

N+ implant is performed through the first polysilicon mask, thereby forming N+ finger regions 611-614 (and conductively doping polysilicon electrodes 601-603). The N+ implant is controlled such that N+ finger regions 611-614 contact the underlying deep n-well region 502. The resulting structure is illustrated in FIG. 6C.

Figure 6D:
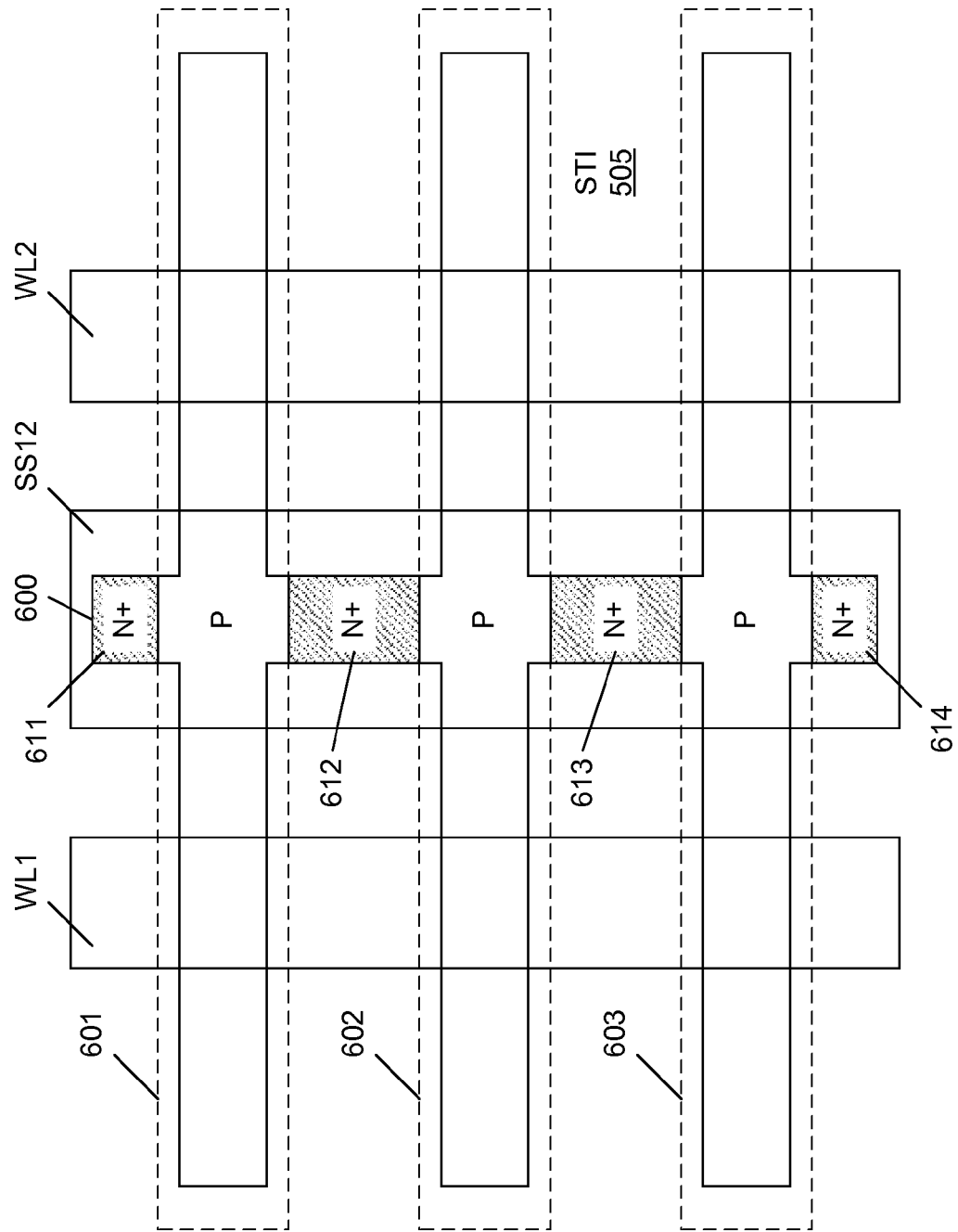

An inter-gate dielectric layer (not shown) is formed over the resulting structure. In the described embodiment, the inter-gate dielectric layer is an oxide-nitride-oxide (ONO) layer. A second polysilicon layer is then formed over the inter-gate dielectric layer. A second polysilicon mask, which defines word lines WL1 and WL2 and source select line SS12, is formed over the second polysilicon layer. The second polysilicon layer is then etched through the second polysilicon mask, thereby forming word lines WL1-WL2 and source select line SS12. This etch is continued through the inter-gate dielectric layer, thereby forming dielectric layers 507-509 (FIGS. 5A-5B). The resulting structure is illustrated in FIG. 6D.

Figure 6E:
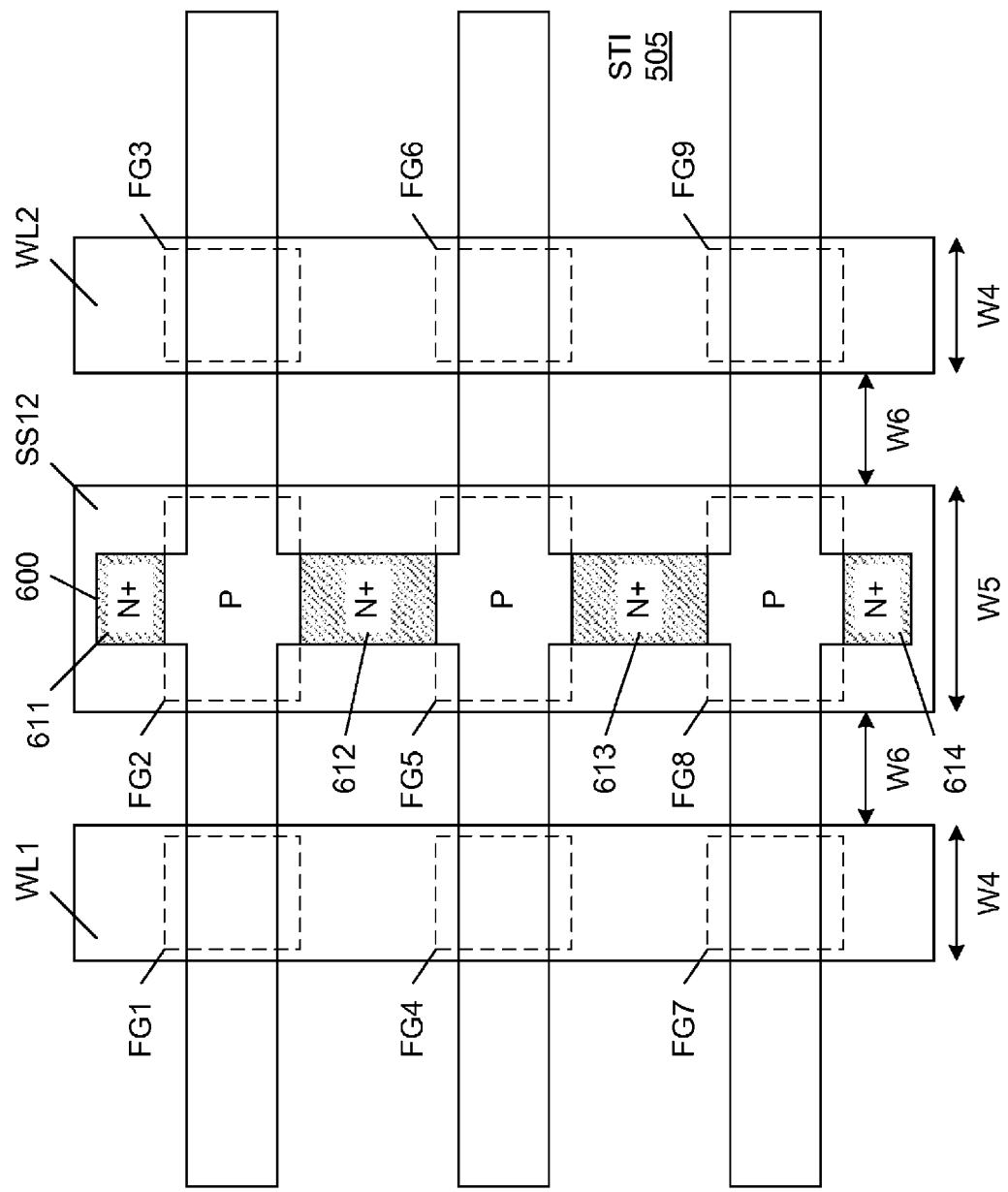

As illustrated in FIG. 6E, the etch is further continued through the exposed portions of polysilicon gate electrodes 601-603, thereby forming floating gates FG1-FG9. In the described embodiment, word lines WL1-WL2 exhibit a width W4 of about 0.25 microns, and source select line SS12 exhibits a width W5 of about 0.4 microns. The spacing W6 between word lines WL1-WL2 and source select line SS12 is about 0.25 microns in the described embodiment.

Figure 6F:
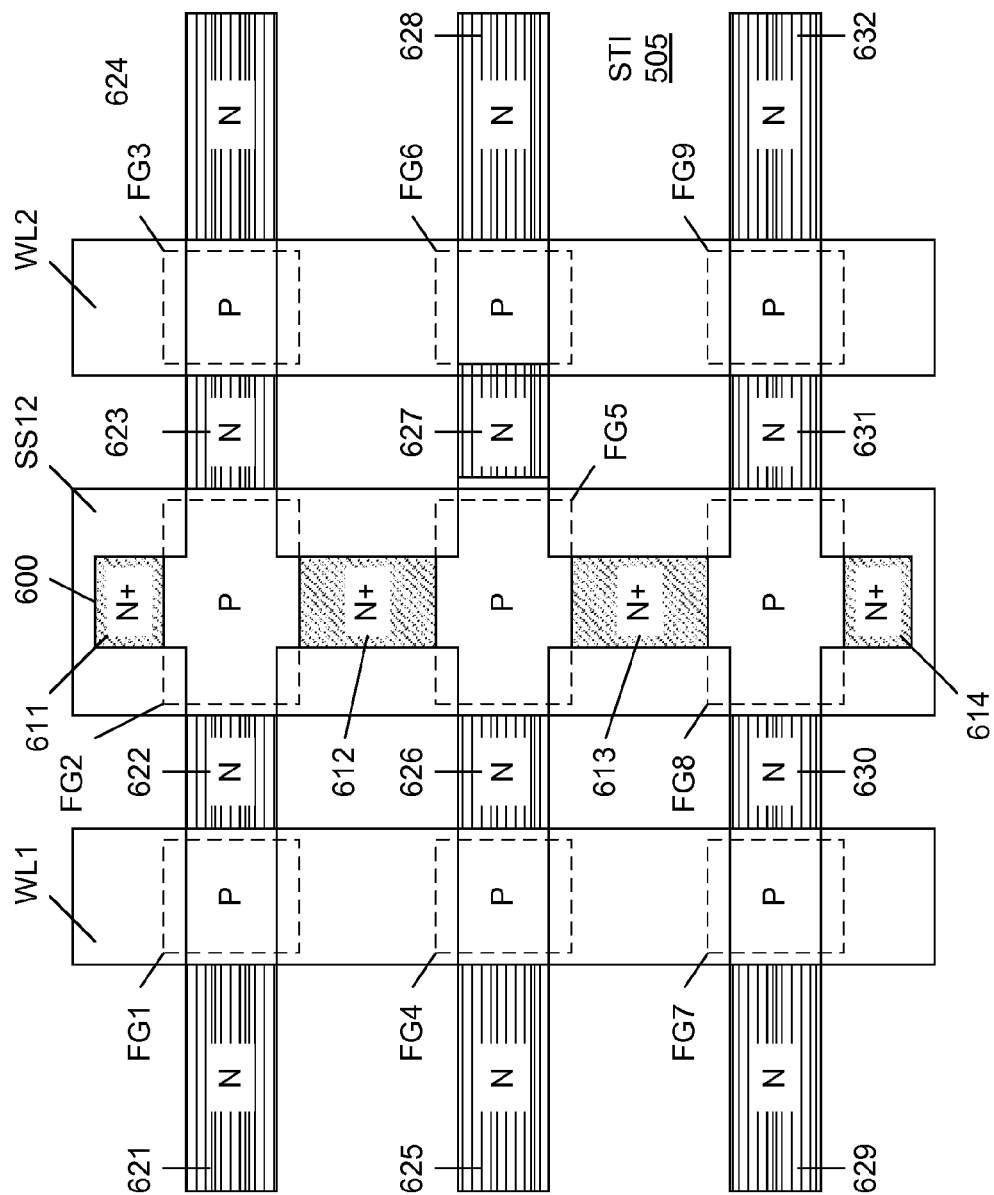

After the second polysilicon mask is removed, an n-type source/drain photoresist mask (not shown) is formed over the resulting structure, and an n-type source/drain implant is performed, thereby creating n-type source/drain regions 621-632 (and conductively doping polysilicon word lines WL1-WL2 and source select line SS12) as illustrated in FIG. 6F. The n-type source/drain mask is subsequently removed.

Figure 6G:
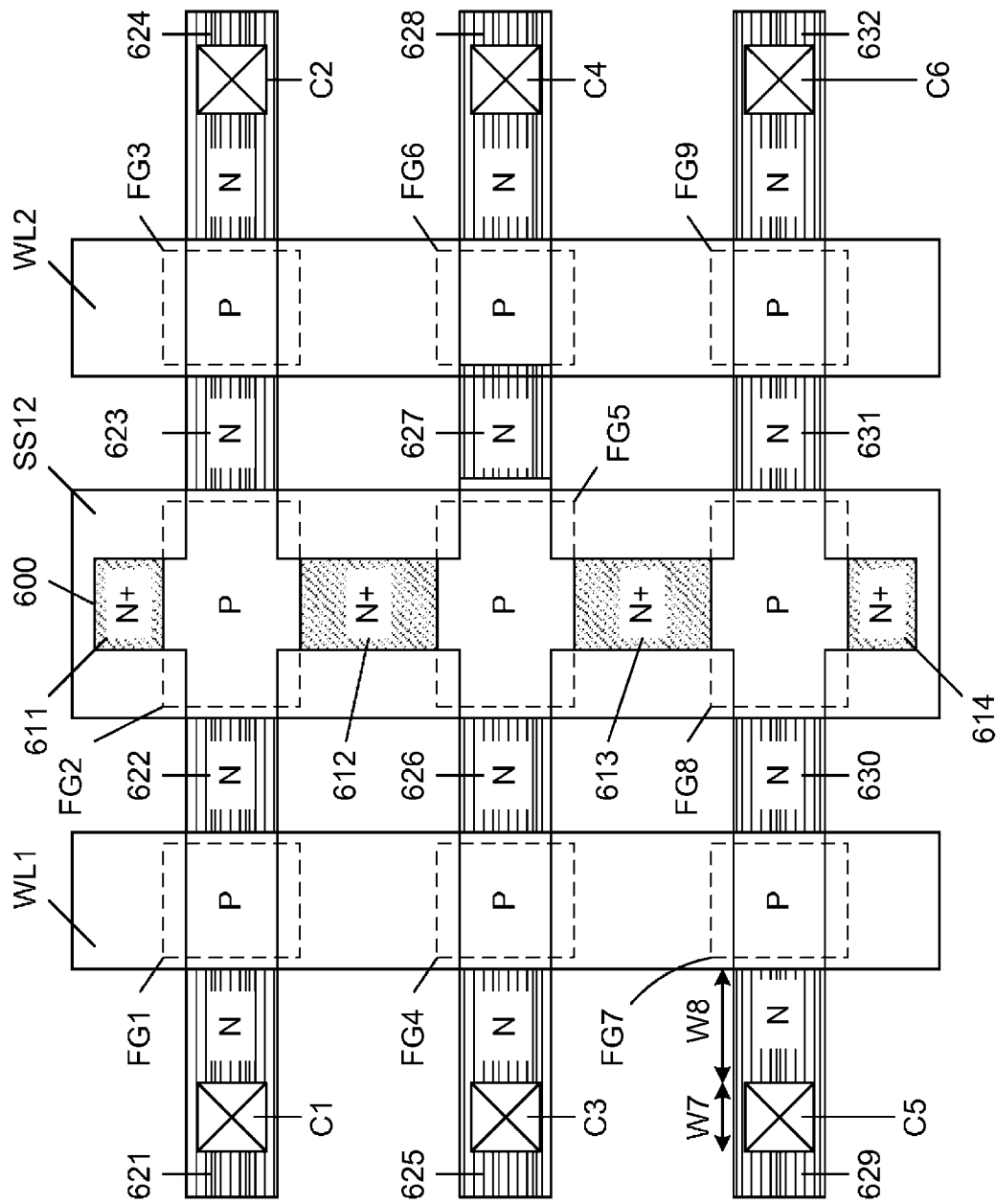

A pre-metal dielectric layer 510 is formed over the resulting structure, and contact openings are formed through this dielectric layer. Contacts C1-C6 are then formed in these contact openings, as illustrated in FIG. 6G. In the described embodiment, each of contacts C1-C6 has a width W7 of about 0.25 microns. Each of contacts C1-C6 is separated from the adjacent word line WL1 or WL2 by a distance W8 of about 0.25 microns. Bit lines BL1-BL3 are then formed, such that bit line BL1 connects contacts C1 and C2; bit line BL2 connects contacts C3 and C4; and bit line BL3 connects contacts C5 and C6. In the described embodiment, each EEPROM cell has a length of about 1.07 microns, a width of about 0.65 microns, and an area of about 0.696 microns$^2$. In the above-described manner, EEPROM array 300 can advantageously be fabricated using a conventional EEPROM process.

The operation of EEPROM array 300 will now be described. Erase operations are performed on a per row basis. For example, to erase the first row of memory transistors 301-303, the control gates of these transistors are grounded by grounding word line WL1. A programming voltage $V_{PP}$ (e.g., 15 Volts) is applied to deep n-well region 502 and p-well region 503 (p-substrate 501 is grounded). The bit lines BL1-BL3 are left floating and source select lines SS12 and SS34 are tied to the programming voltage $V_{PP}$. Under these conditions, a tunneling current flows from p-well region 503 to the floating gates (FG1, FG4 and FG7) of memory transistors 301, 302 and 303. As a result, electrons are removed from the floating gates of memory transistors 301-303, thereby erasing these memory transistors.

Other rows of EEPROM array 300 can be erased at the same time by grounding the corresponding word line. For example, grounding word line WL3 would cause the third row of memory transistors 307-309 to be erased at the same time as the first row of memory transistors 301-303.

The programming voltage $V_{PP}$ is applied to the control gates of memory transistors that are not to be erased. For example, applying the programming voltage $V_{PP}$ to word lines WL2-WL4 will apply the programming voltage $V_{PP}$ to the control gates of memory transistors 304-312, thereby preventing these memory transistors from being erased.

Programming operations will now be described. To program memory transistor 301, the programming voltage $V_{PP}$ is applied the corresponding word line WL1, and the corresponding bit line BL1 is grounded. Deep n-well region 502, p-well region 503 and source select line SS12 are also grounded. Under these conditions, a tunnel current flows from the floating gate FG1 of memory transistor 301 to p-well region 503. As a result, electrons are injected into the floating gate FG1 of memory transistor 301, thereby programming this memory transistor.

Applying an intermediate voltage $V_{INT}$ (e.g., 3 ... 5 Volts) to bit lines BL2-BL3 prevents memory transistors 302 and 303 from being programmed at the same time as memory transistor 301. More specifically, the intermediate voltage VINT inhibits tunneling current in these memory transistors 302-303. Memory transistor 302 and/or memory transistor 303 can be programmed at the same time as memory transistor 301 by grounding the corresponding bit line(s). For example, memory transistor 303 can be programmed at the same time as memory transistor 301 by grounding the corresponding bit line BL3 (in combination with the above-described conditions for programming memory transistor 301). Thus, programming can be performed on a per bit manner within a single row.

Moreover, grounding word lines WL2-WL4 prevents memory transistors 304, 307 and 310 from being programmed at the same time as memory transistor 301. More specifically, grounding word lines WL2-WL4 inhibits tunneling current in these memory transistors 304, 307 and 310. Memory transistors 304, 307 and/or 310 can be programmed at the same time as memory transistor 301 by applying the programming voltage $V_{PP}$ to the corresponding word line(s). For example, memory transistor 307 can be programmed at the same time as memory transistor 301 by applying the programming voltage $V_{PP}$ to the corresponding word line WL3 (in combination with the above-described conditions for programming memory transistor 301). Thus, programming can be performed on a per bit manner within a single column. Note that all bits located at an intersection of a selected row and a selected column will have the same programmed state. This is useful for writing test patterns in block mode.

Advantageously, the high programming voltage $V_{PP}$ is not applied to the drain junctions of memory transistors 301-312 during erase and program operations. Furthermore, the high programming voltage $V_{PP}$ is not applied across bit lines BL1-BL3 and p-well region 503 or n-well region 502. Moreover, the high programming voltage $V_{PP}$ is not applied across source select lines SS12-SS34 and p-well region 503 or n-well region 504. Consequently, the source access transistors 321-326 and memory transistors 301-313 may be scaled to sub-0.35 micron processes.

Read operations are performed on a per row basis. For example, the first row of memory transistors 301-303 are read as follows. A first read voltage VR1 of about 0.5 to 1.5 Volts, depending on the sense amplifier design, is applied to each of bit lines BL1-BL3, and the $V_{DD}$ supply voltage (about 2.5 Volts) is applied to the corresponding word line WL1 and the corresponding source select line SS12. Non-selected word lines WL2-WL4 and corresponding source select line SS34 are grounded. P-well region 503 is grounded and deep n-well region 502 is held at a second read voltage $V_{R2}$ of about 0.5 to 1.0 Volts. Under these conditions, significant read current will flow through erased memory transistors in the first row, while no significant read current will flow through programmed memory transistors in the first row or through erased cells of the deselected second row. Sense amplifiers coupled to bit lines BL1-BL3 identify the read currents flowing through memory transistors 301-303 (and therefore the logic states of the bits stored by these memory transistors). Note that the read current associated with memory transistor 301 will flow along a path that includes: deep n-well 502, n+ regions 611-612, source region 622 and drain region 621. In this manner, deep n-well region 502 provides a common source region for all of the EEPROM cells in array 300.

Figure 7:
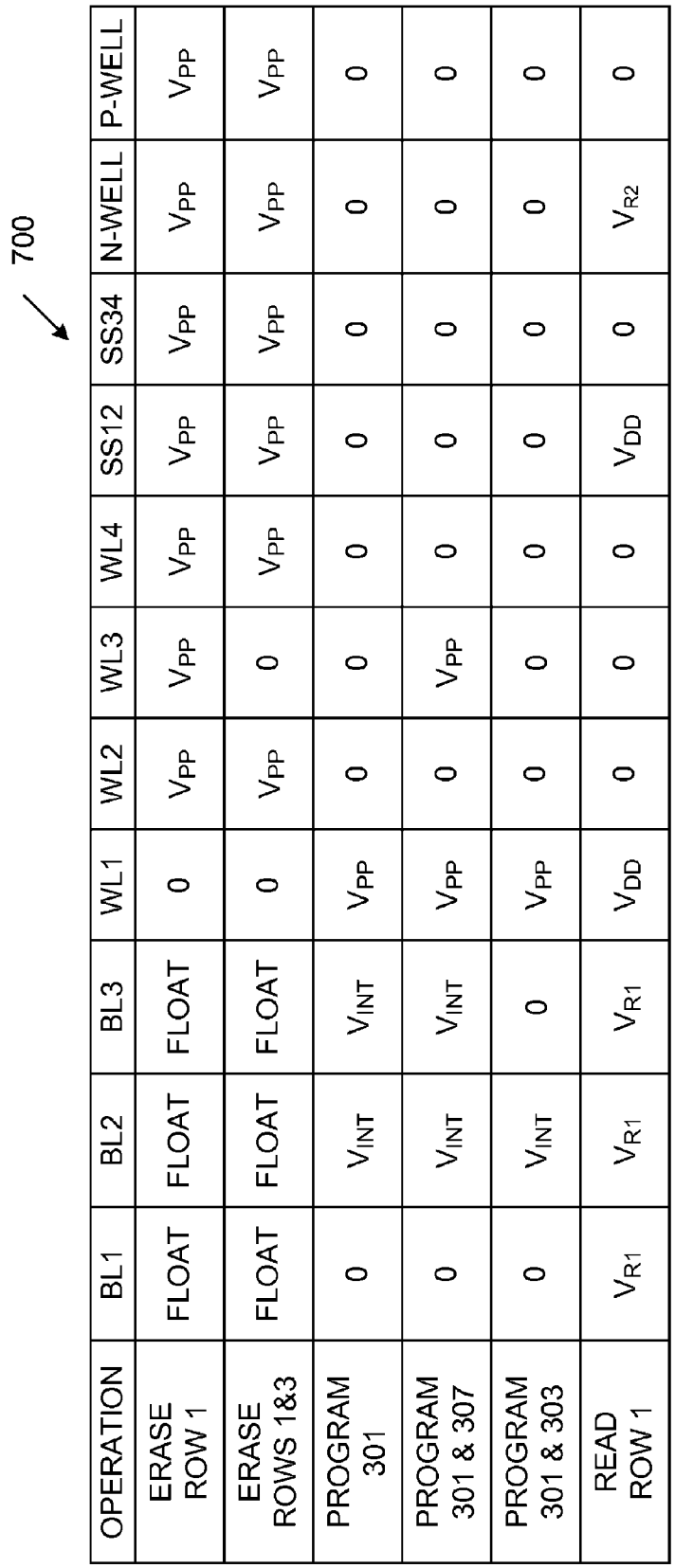
FIG. 7 is a table that summarizes erase, program and read operations of the EEPROM array of FIG. 3 in accordance with various embodiments of the present invention.

FIG. 7 is a table 700 that summarizes various erase, program and read operations of EEPROM array 300.

Under the operating conditions described above, source access transistors 321-326 are never biased such that tunneling current will flow into or out of the floating gates associated with these select access transistors. For example, floating gates FG2, FG5 and FG8 associated with source access transistors 321-323 (see, FIGS. 5B and 6G) are never subject to program or erase conditions. Thus, source access transistors 321-326 are operated as conventional (non-memory) transistors, even though each of these transistors has the basic structure of a non-volatile memory transistor. In the above described embodiments, source access transistors 321-326 are fabricated in a manner that simplifies the process required to fabricate EEPROM array 300.

Figure 8A:
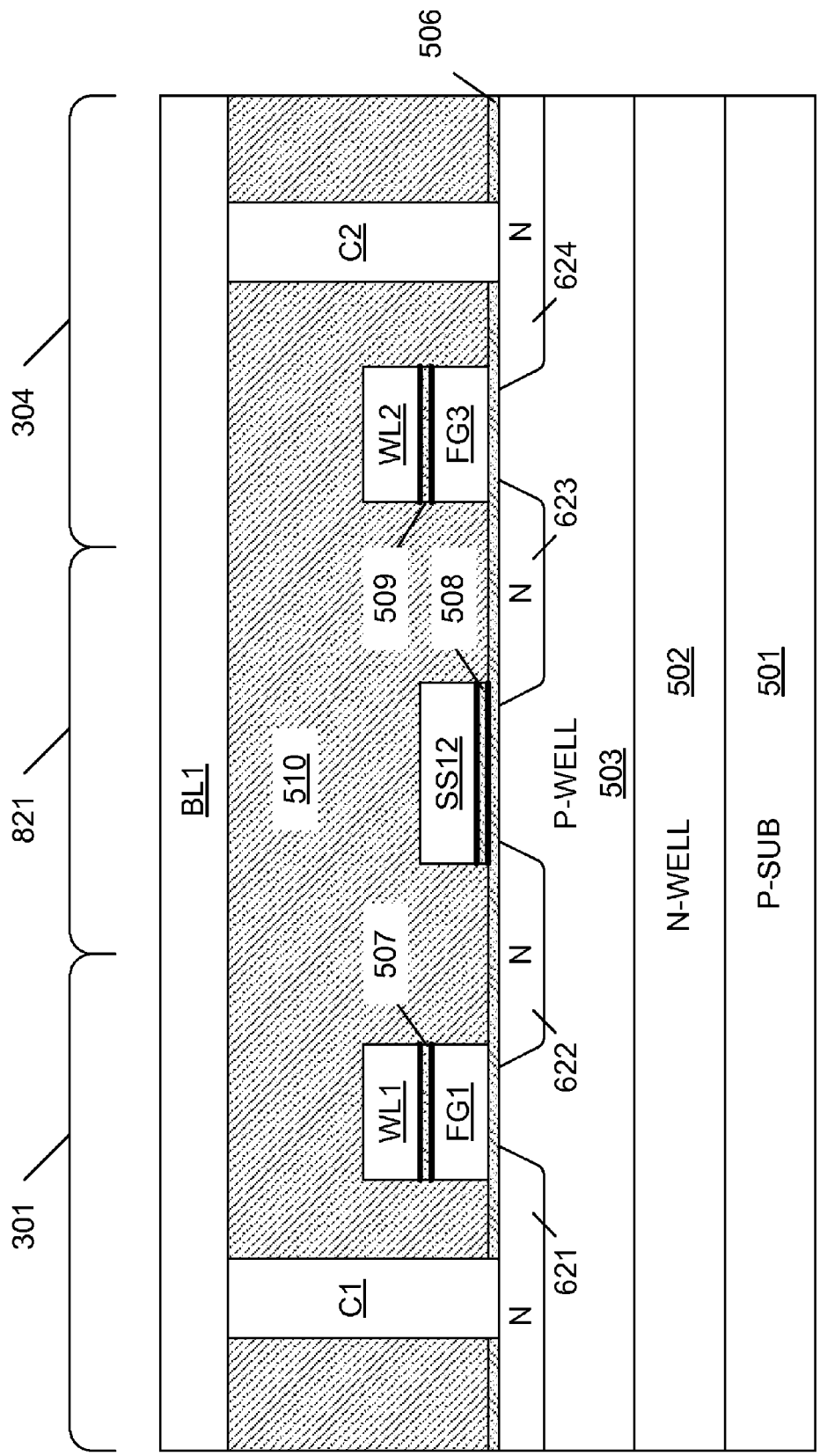
FIGS. 8A and 8B are cross sectional views illustrating source select transistors fabricated in accordance with an alternate embodiment of the present invention.
Figure 8B:
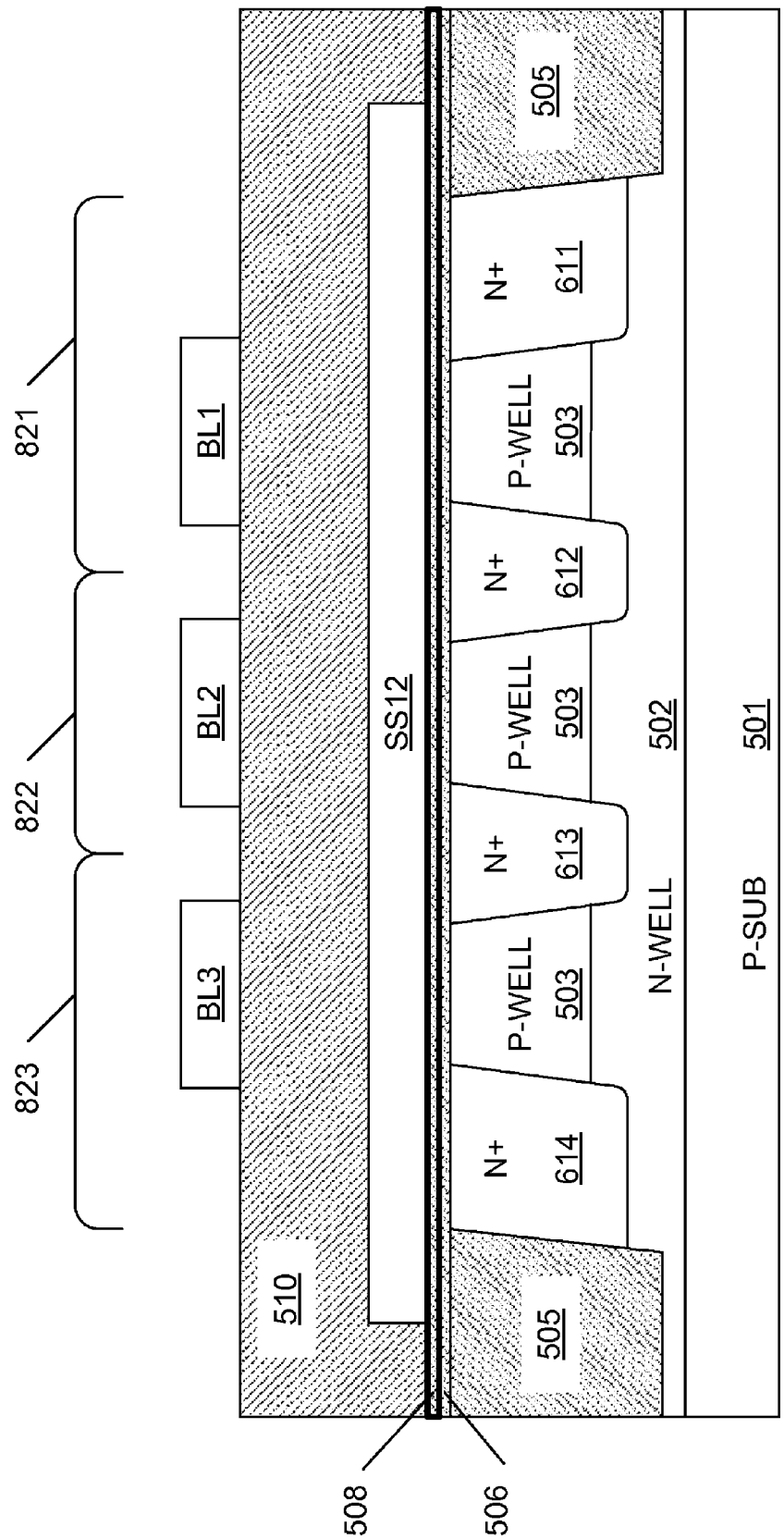

However, in an alternate embodiment, source access transistors 321-326 can be fabricated in different manners. For example, after the N+ regions 611-614 are formed (see, FIG. 6C), polysilicon electrodes 601-603 can be patterned and etched to remove the portions of these electrodes that eventually become floating gates FG2, FG5 and FG8. Processing then continues in the manner described above in FIGS. 6D-6G. FIGS. 8A and 8B are cross sectional views of the resulting source access transistors 821-823, along the same section lines as FIGS. 5A and 5B, respectively. The source access transistors 831-833 of this embodiment will exhibit better performance (because the floating gates FG2, FG5 and FG8 have been eliminated), at the expense of a slightly more complicated process. In alternate embodiments, the process can be further modified such that the gate dielectric of source access transistors 831-833 include only gate dielectric layer 506 or only ONO structure 508 (but not both). In yet another embodiment, the process is further modified so that source access transistors 831-833 include a custom gate dielectric.

In yet another embodiment, the floating gates FG2, FG5 and FG8 are replaced with a continuous floating gate, which is electrically shorted to the overlying source select line SS12. This embodiment will now be described in more detail.

Figure 9:
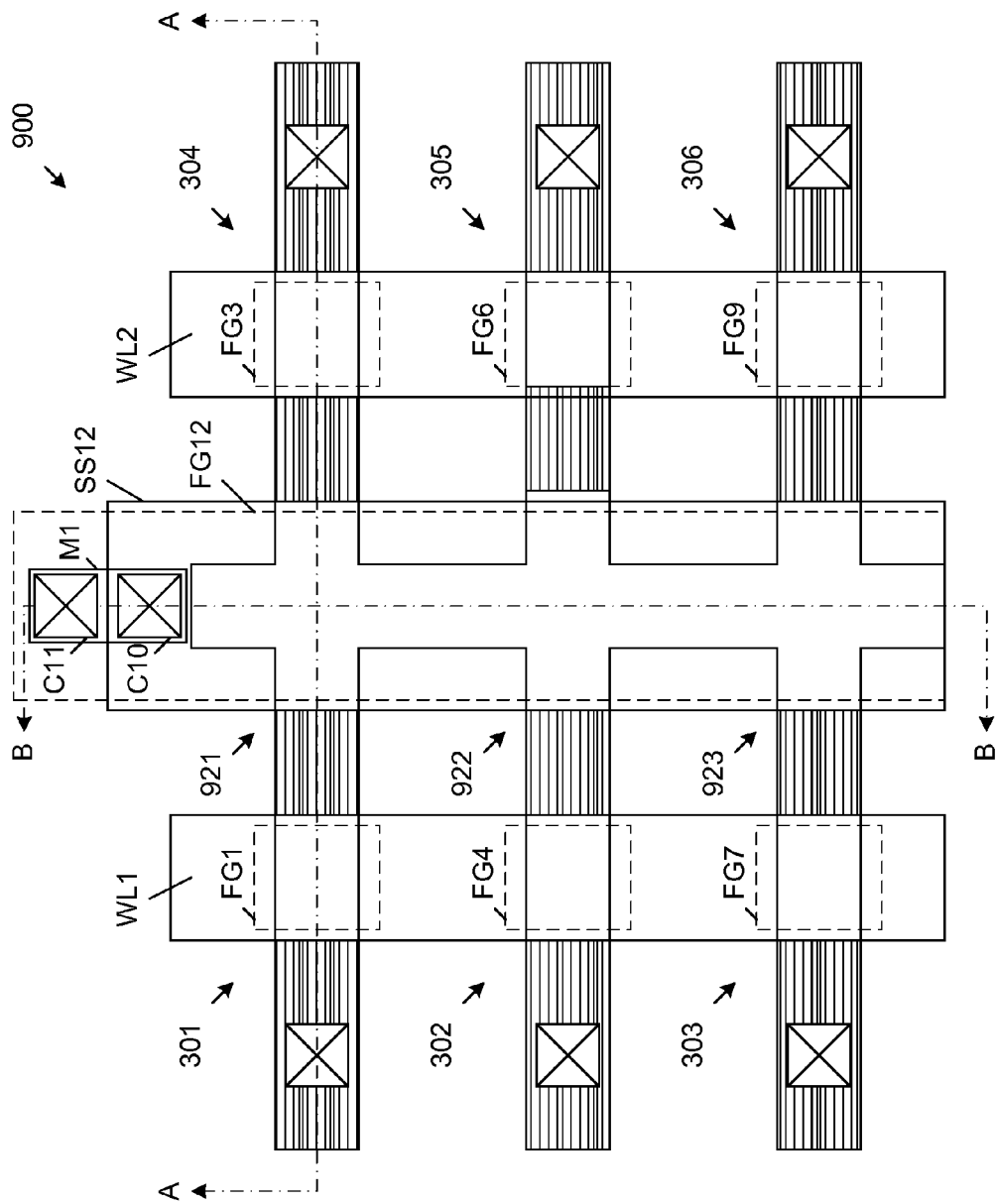
FIG. 9 is a top layout view of the first two rows of an array 900 in accordance with the presently described alternate embodiment of the invention.

FIG. 9 is a top layout view of the first two rows of an array 900 in accordance with the presently described alternate embodiment of the invention. Because the array 900 of FIG. 9 is similar to the array of FIG. 4, similar elements FIGS. 4 and 9 are labeled with similar reference numbers. Thus, the array of FIG. 9 includes memory transistors 301-306, word lines WL1-WL2 and source select line SS12, which have been described above in connection with FIG. 4. In addition, the array of FIG. 9 includes source access transistors 921-923, which replace the source access transistors 321-323 of the array of FIG. 4. Source access transistors 921-923 share a common floating gate FG12 (in contrast with source access transistors 321, 322 and 323, each of which has a discrete corresponding floating gate FG2, FG5 and FG8, respectively). The common floating gate FG12 is connected to the source select line SS12 by metal contacts C10-C11 and metal trace M1. The source access transistors 921-923 of the array of FIG. 9 do not include N+ finger regions which contact the underlying N-well region (unlike source access transistors 321-323 of the array of FIG. 4, which include N+ finger regions 611-614). The significance of these differences between the array of FIG. 9 and the array of FIG. 4 will become apparent in view of the following description.

Figure 10A:
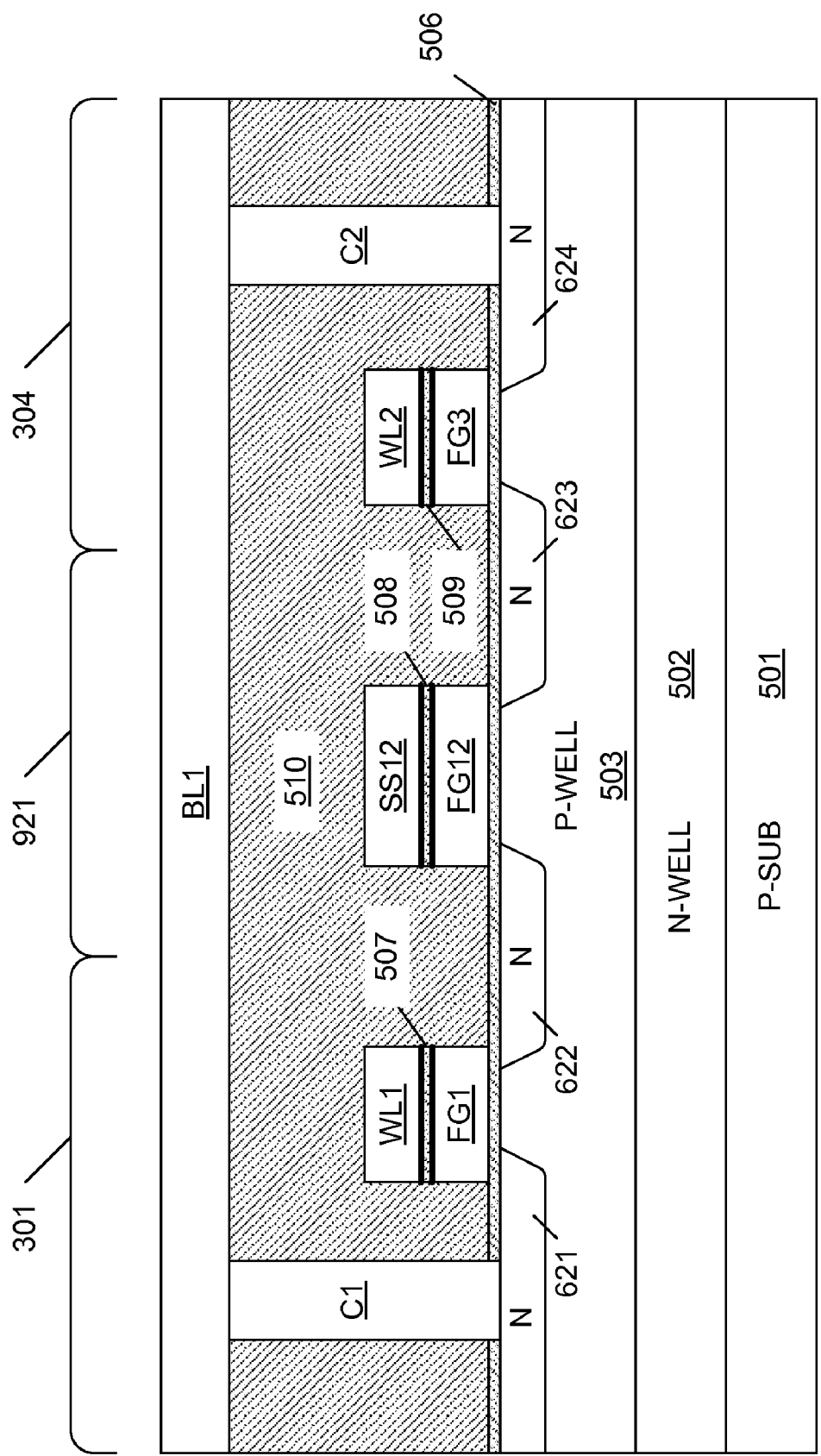
FIG. 10A is a cross-sectional view of an EEPROM cell pair along section line A-A of FIG. 9.
Figure 10B:
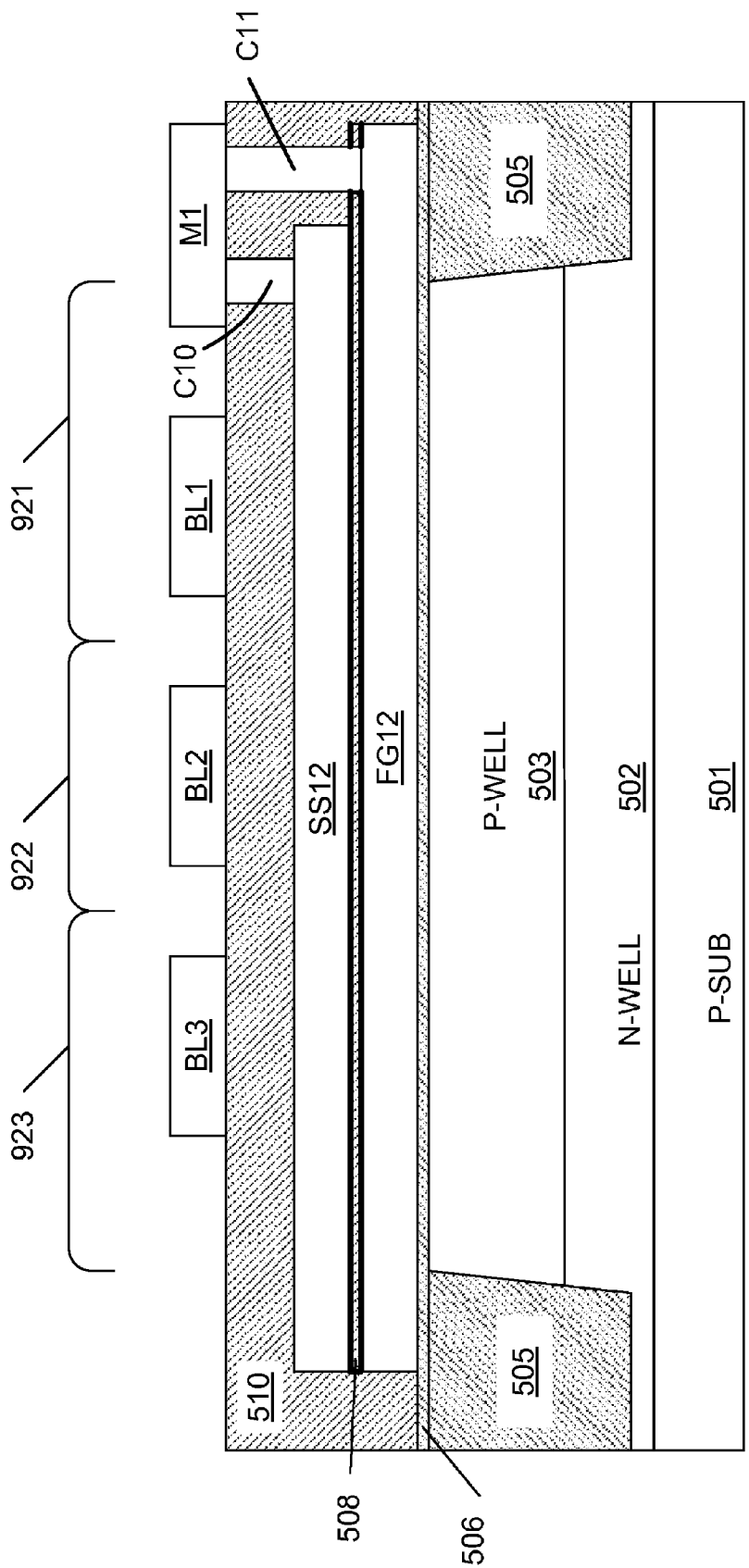
FIG. 10B is a cross-sectional view of three source access transistors along section line B-B of FIG. 9.

FIG. 10A is a cross-sectional view of EEPROM cells 301 and 304 and source access transistor 921, along section line A-A of FIG. 9. FIG. 10B is a cross-sectional view of source access transistors 921-923 along section line B-B of FIG. 9.

As shown in FIGS. 10A and 10B, EEPROM array 900 includes p-type substrate 501, deep N-well region 502, p-well region 503, shallow trench isolation regions 505, tunnel gate dielectric layer 506, inter-gate dielectric layers 507-509, pre-metal dielectric layer 510, n-type source/drain regions 621-624, floating gates FG1 and FG3, word lines (control gates) WL1-WL2, contacts C1 and C2, and bit lines BL1-BL3, which have been described above in connection with FIGS. 5A and 5B.

In addition, source access transistors 921-923 include a continuous floating gate FG12 located over tunnel gate dielectric layer 506. The inter-gate dielectric layer 508 is located between the continuous floating gate FG12 and the overlying source select line SS12. A contacts C10 and C11 extends through the pre-metal dielectric layer 510 (and the inter-gate dielectric layer 508 in the case of contact C11) to electrically contact source select line SS12 and floating gate FG12, respectively. Metal trace M1 electrically connects contacts C10 and C11, such that floating gate FG12 is electrically connected to source select line SS12. In the illustrated embodiment, contacts C10-C11 and metal trace M1 are formed at an edge of the array. In another embodiment, another contract structure, similar to the contact structure formed by contacts C10-C11 and metal trace M1, can be provided at an opposite edge of the array. Applying source select control voltage to metal trace M1 advantageously causes this control voltage to be applied to both the floating gate FG12 and the source select line SS12. Because the floating gate FG12 is only separated form the underlying p-well region 503 by the tunnel gate dielectric layer 506, improved gate voltage coupling is provided for the source select transistors 921-923, thereby improving the performance of these source select transistors.

As will become apparent in view of the following description, fabrication of the continuous floating gate FG12 effectively prevents the formation N+ finger regions, such as N+ finger regions 611-614 illustrated in FIG. 5B.

FIGS. 11A-11E are top views of memory transistors 301-306 and source access transistors 921-923 during various stages of fabrication, in accordance with one embodiment of the present invention.

Figure 11A:
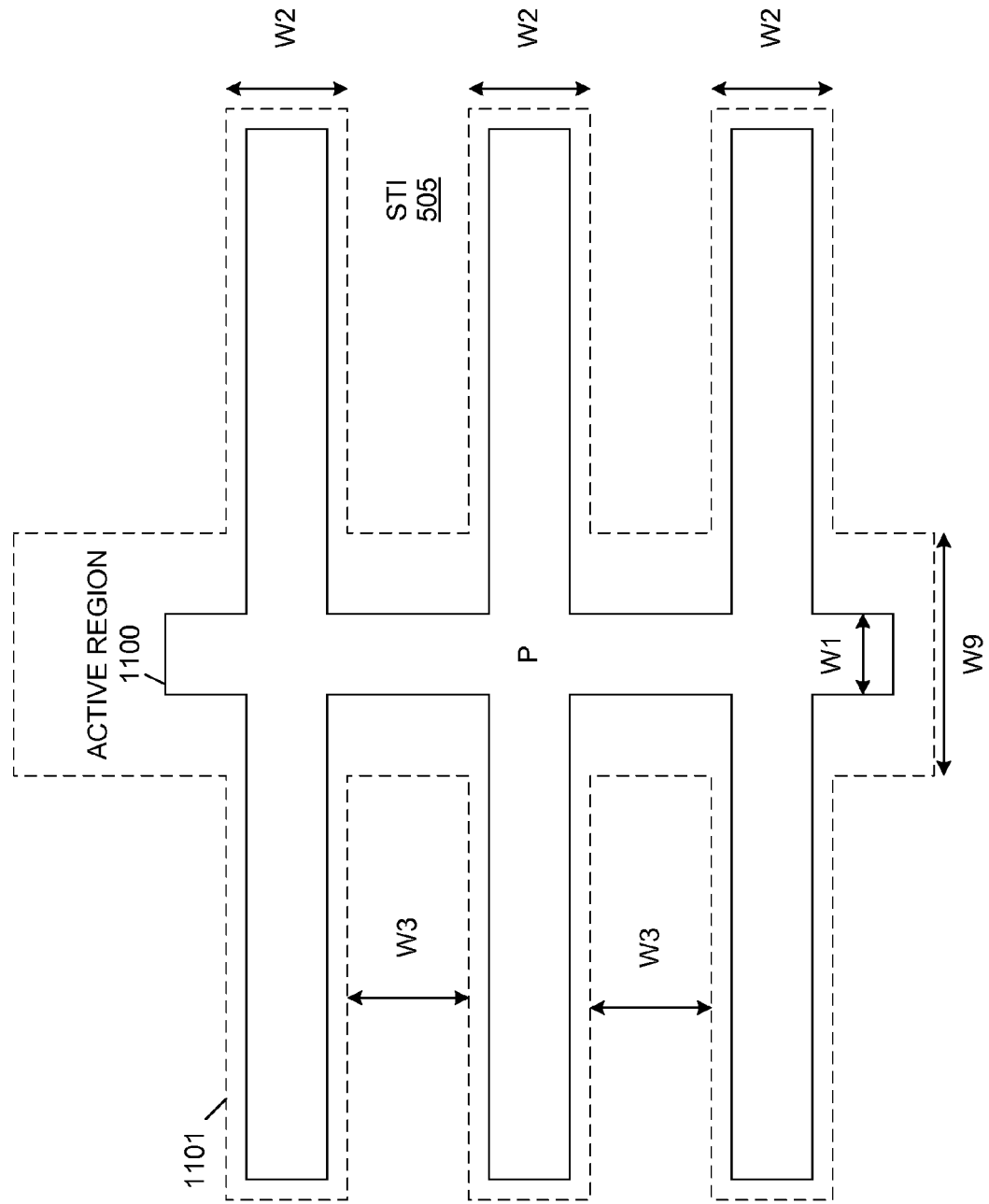

As illustrated in FIG. 11A, shallow trench isolation (STI) region 505 is formed on the upper surface of substrate 501, thereby defining the active region 1100 where transistors 301-306 and 921-923 will be formed. At this time, deep n-well region 502 has already been formed. P-well region 503 can be formed either before or after STI region 505 is formed. In accordance with the described embodiment, transistors 301-306 and 921-923 are fabricated using a 0.25 micron process. In this embodiment, active region 1100 exhibits a dimension W1 of 0.25 microns. Note that array 300 can be fabricated using other processes and other dimensions in other embodiments. Also note that the active region associated with additional rows of the array would be continuous with active region 1100.

After active region 1100 has been defined, tunnel gate dielectric layer 506 is formed over the exposed surface of p-well region 503 in the manner described above in connection with FIG. 6A. A first layer of polysilicon is formed over the resulting structure. This polysilicon layer is then patterned through a first polysilicon mask to form patterned polysilicon structure 1101. The patterned polysilicon structure 1101 exhibits widths W2 of about 0.4 microns, spacings W3 of about 0.25 microns, and a width W9 of about 0.5 microns.

Figure 11B:
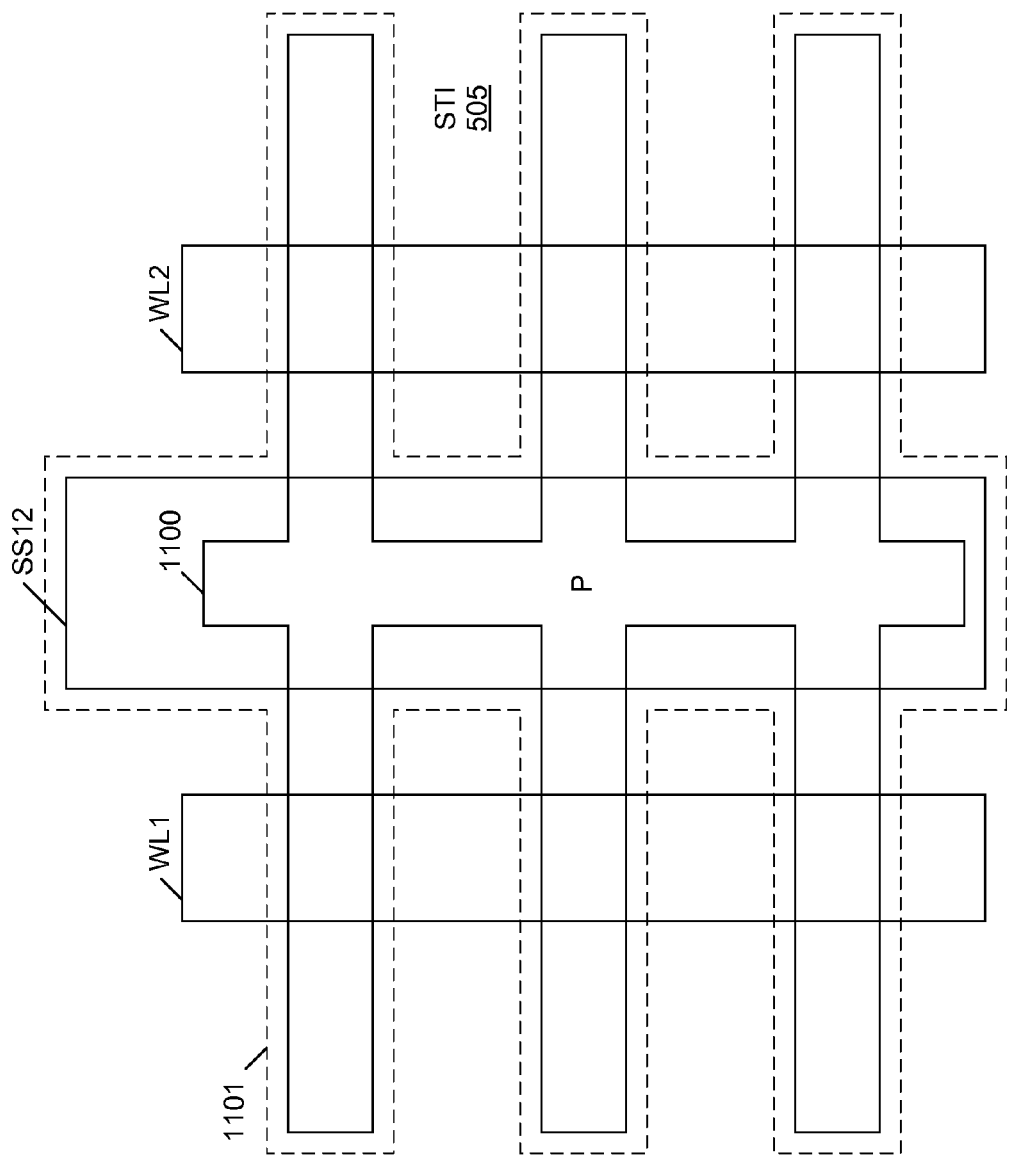

An inter-gate dielectric layer (not shown) is formed over the resulting structure. In the described embodiment, the inter-gate dielectric layer is an oxide-nitride-oxide (ONO) layer. A second polysilicon layer is then formed over the inter-gate dielectric layer. A second polysilicon mask, which defines word lines WL1 and WL2 and source select line SS12, is formed over the second polysilicon layer. The second polysilicon layer is then etched through the second polysilicon mask, thereby forming word lines WL1-WL2 and source select line SS12. This etch is continued through the inter-gate dielectric layer, thereby forming inter-gate dielectric layers 507-509 (FIGS. 10A-10B). The resulting structure is illustrated in FIG. 11B.

As illustrated in FIG. 11C, the etch is further continued through the exposed portions of patterned polysilicon structure 1101, thereby forming floating gates FG1, FG3-FG4, FG6-FG7, FG9 and FG12. The second polysilicon mask is then removed. In the described embodiment, word lines WL1-WL2 exhibit a width W4 of about 0.25 microns, and source select line SS12 exhibits a width W5 of about 0.4 microns. The spacing W6 between word lines WL1-WL2 and source select line SS12 is about 0.25 microns in the described embodiment.

Figure 11D:
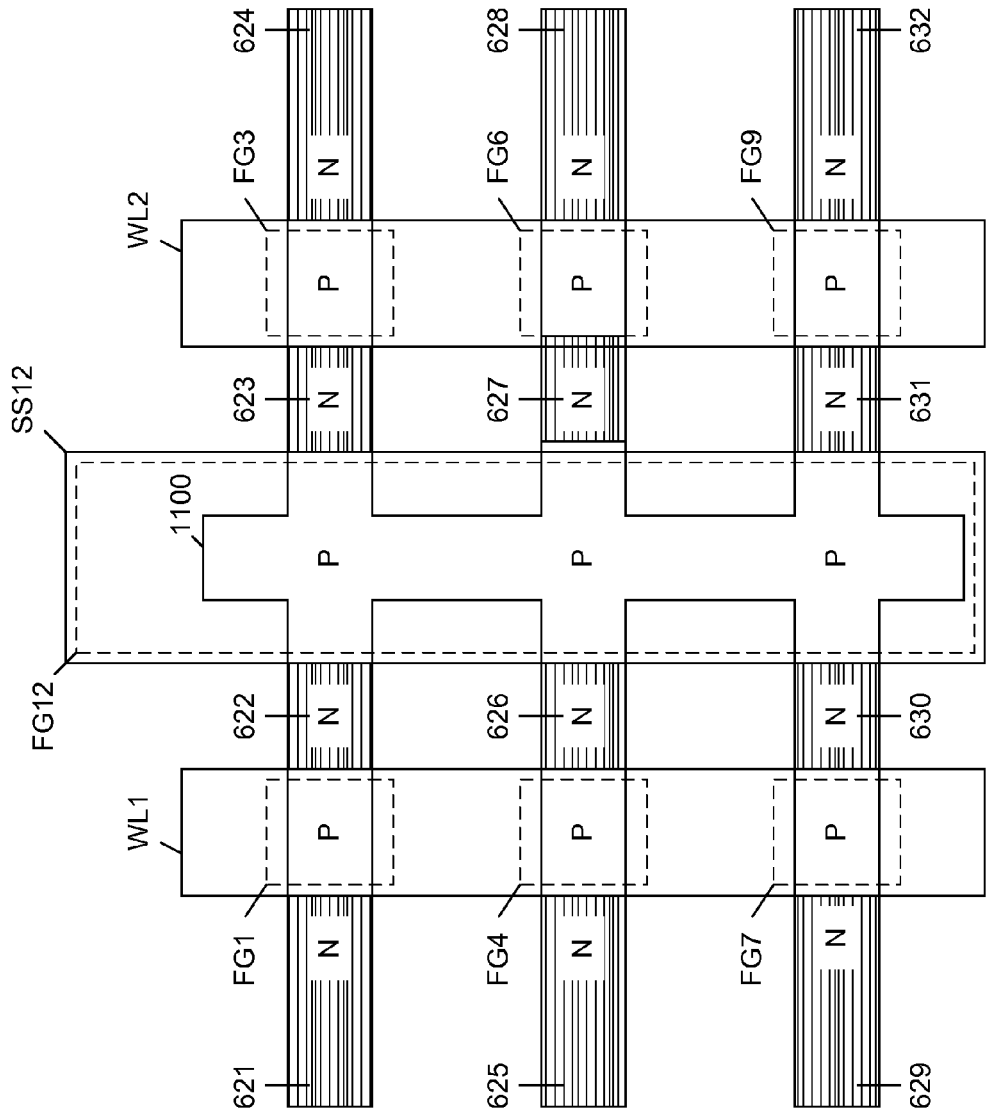

After the second polysilicon mask is removed, an n-type source/drain photoresist mask (not shown) is formed over the resulting structure, and an n-type source/drain implant is performed, thereby creating n-type source/drain regions 621-632 (and conductively doping polysilicon word lines WL1-WL2 and source select line SS12) as illustrated in FIG. 11D. The n-type source/drain mask is subsequently removed.

Figure 11E:
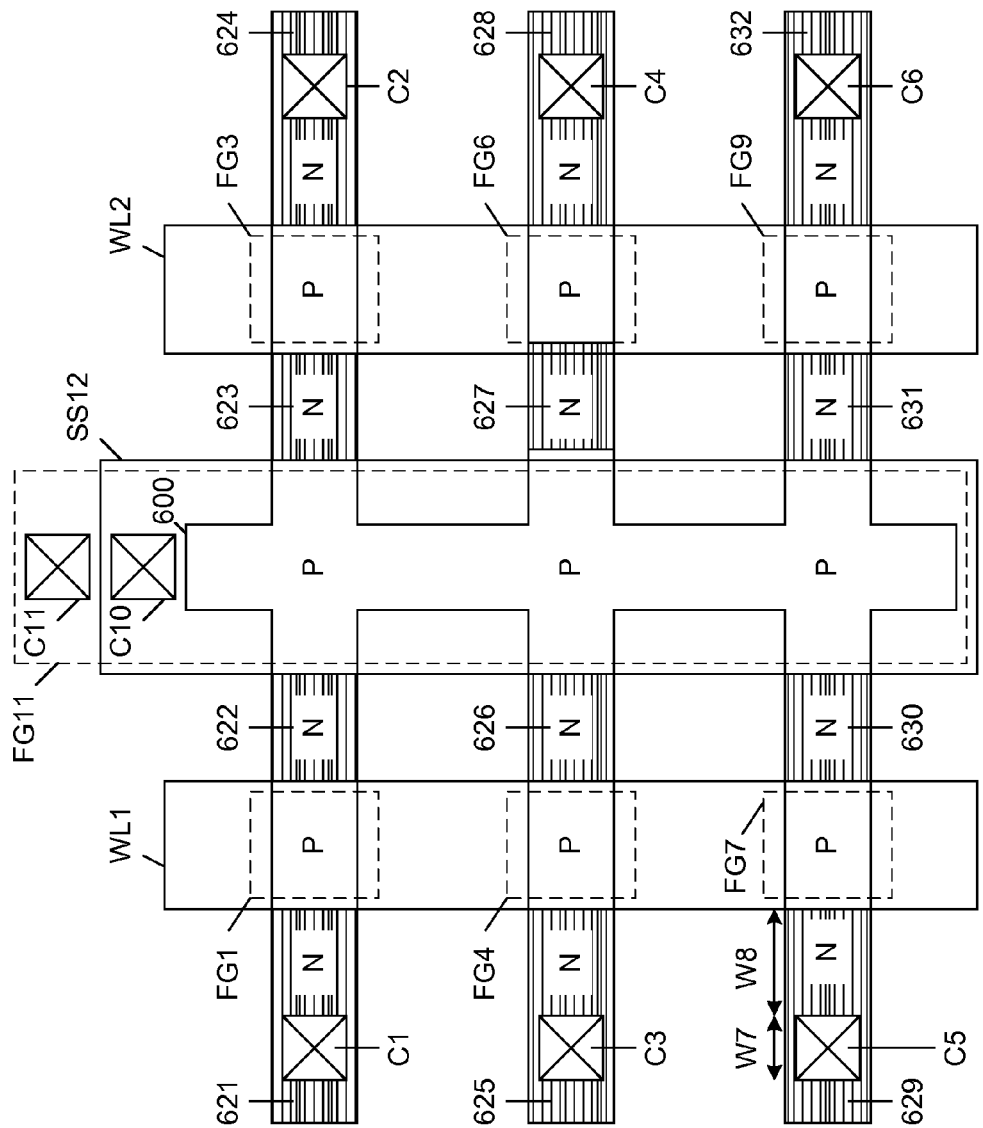

A third polysilicon mask is then formed over the resulting structure. The third polysilicon mask exposes the location where contact C11 is to be formed. That is, the third polysilicon mask exposes the portion of source select line SS12 that must be removed in order to expose the underlying floating gate electrode FG11. An etch is performed through the third polysilicon mask, thereby removing the exposed portion of the source select line SS12. This results of this etch are illustrated in FIG. 11E. The third polysilicon mask is then removed.

A pre-metal dielectric layer 510 is formed over the resulting structure, and contact openings are formed through this dielectric layer. Contacts C1-C6 and C10-C11 are then formed in these contact openings, as illustrated in FIG. 11E. In the described embodiment, each of contacts C1-C6 and C10-C11 has a width W7 of about 0.25 microns. Each of contacts C1-C6 is separated from the adjacent word line WL1 or WL2 by a distance W8 of about 0.25 microns. Bit lines BL1-BL3 and metal trace M1 are then formed, such that bit line BL1 connects contacts C1 and C2; bit line BL2 connects contacts C3 and C4; bit line BL3 connects contacts C5 and C6; and metal trace M1 connects contacts C10 and C11. In the described embodiment, each EEPROM cell has a length of about 1.07 microns, a width of about 0.65 microns, and an area of about 0.696 microns$^2$. Note that above dimensional numbers are provide one example, which is appropriate for a generic 0.18 micron process. A person skilled in the art would be capable of modifying these dimensional numbers for use with other processes.

Because the source select transistors 921-923 do not include N+ finger regions providing connections to the underlying deep N-well region 502, other circuitry must be provided to enable read current to be supplied to the rows of EEPROM transistors 301-306 during read operations. In accordance with one embodiment, at least one additional column is added to the array, wherein each additional column is configured to operate as a source supply circuit in the manner described below.

Figure 12:
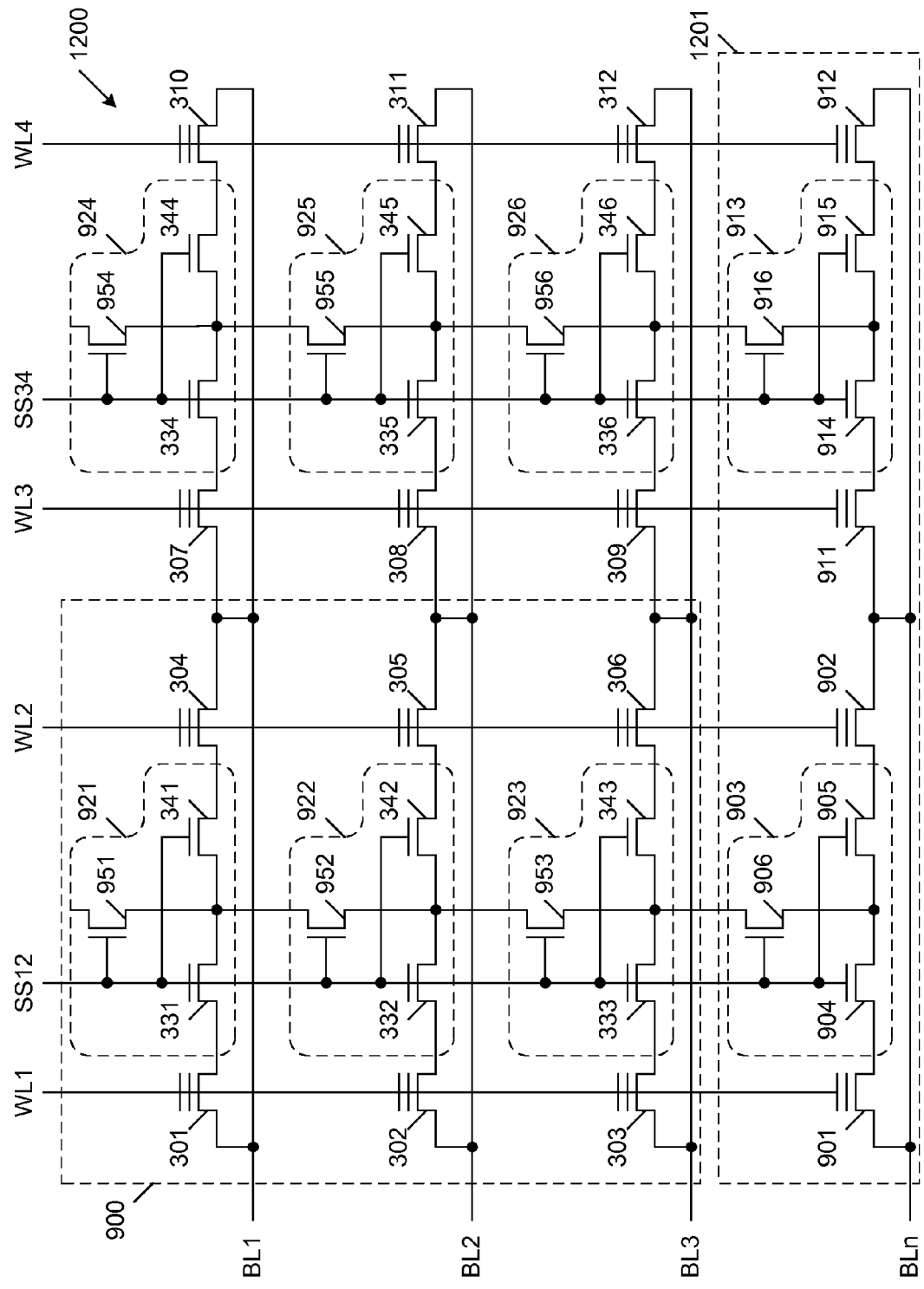
FIG. 12 is a circuit diagram of an EEPROM array in accordance with an alternate embodiment of the present invention, which includes the array structure of FIG. 9 and one additional column configured to operate as a source supply circuit.

FIG. 12 is a circuit diagram of an EEPROM array 1200 in accordance with the present embodiment, which includes one additional column 1201 configured to operate as a source supply circuit. This additional column 1201, which is identified by the corresponding bit line BLn, can be referred to as source access column 1201. EEPROM array 1200 includes the array 900, which is described above in connection with FIGS. 9, 10A-10B and 11A-11E. Array 900 is duplicated in array 1200, thereby providing floating gate non-volatile memory transistors 307-312, source access transistors 924-926, word lines WL3-WL4, and source select line SS34.

The source access column 1201 of array 1200 includes bit line BLn, non-volatile memory transistors 901-902 and 911-912, and source access transistors 903 and 913. The source access column 1201 is substantially identical to the other three columns, with differences noted below. Note that source access transistor 903 shares the same source select electrode SS12 and the same continuous floating gate electrode FG12 with source select transistors 921-923. Similarly, source access transistor 913 shares the same source select electrode SS34 and the same continuous floating gate electrode with source select transistors 924-926.

Source access transistors 921-926 include transistor structures 331-336, respectively, and transistor structures 341-346, respectively, which have been described above in connection with array 300 (FIG. 3, source access transistors 321-326). In addition, source access transistors 921-926 include transistor structures 951-956, respectively. Similarly, within the additional column, source access transistors 903 and 913 include transistors structures 904 and 914, respectively, transistor structures 905 and 915, respectively, and transistor structures 906 and 916, respectively. Transistor structures 951-953 and 906 couple the source access transistors 921-923 and 903. Similarly, transistor structures 954-956 and 916 couple the source access transistors 924-926 and 913.

In accordance with the present embodiment, non-volatile memory transistors 901-902 and 911-912 are always in a conductive state. This can be achieved, for example, by shorting the source/drain diffusion regions of these transistors, or by programming these transistors to always have a conductive state.

FIG. 13 is a table 1300 that summarizes erase, program and read operations of the EEPROM array of FIG. 12 in accordance with one embodiment of the present invention. Erase and program operations are performed in the same manner described above in connection with FIG. 7.

During a read access of a selected row, the $V_{DD}$ supply voltage is applied to the word line and the source select line associated with the selected row. For example, for a read access of the first row, the $V_{DD}$ supply voltage is applied to word line WL1 and to source select line SS12. During each read access, a first read voltage VR1 is applied to the bit lines BL1-BL3, and a second read voltage VR2 is applied to the bit line BLn.

Because the non-volatile memory transistors 901-902 and 911-912 of the source access column 1201 are always conductive, the second read voltage VR2 applied to bit line BLn is also applied to transistor structures 904-905 of source access transistor 903, and to transistor structures 914-915 of source access transistor 913. The VDD supply voltage applied to source select line SS12 causes transistor structures 904-906, 331-333, 341-343 and 951-953 to turn on, such that the second read voltage VR2 is applied to the sources of non-volatile memory transistors 301-306. The VDD supply voltage applied to word line WL1 causes the resulting currents on bit lines BL1-BL3 to be representative of the programmed/erased states of non-volatile memory transistors 301-303. Note that even though the second read voltage VR2 is applied to the sources of non-volatile memory transistors 304-306, these transistors are turned off by the 0 Volt signal applied to word line WL2. Further note that even though the second read voltage VR2 is applied to transistor structures 914-915 of source access transistor 913, these transistor structures are turned off by the 0 Volt signal applied to source select line SS34.

Although the embodiment illustrated in FIG. 12 shows that the source access column 1201 supplies read current to three non-volatile memory transistors 301-303, it is understood that this source access column can supply read current to other numbers of memory transistors in other embodiments. For example, the source access column 1201 could be configured to provide read current to eight memory transistors (eight columns). In accordance with another embodiment, a second source access column is provided at the opposite end of the array (i.e., at the end opposite source access column 1201).

Figure 14:
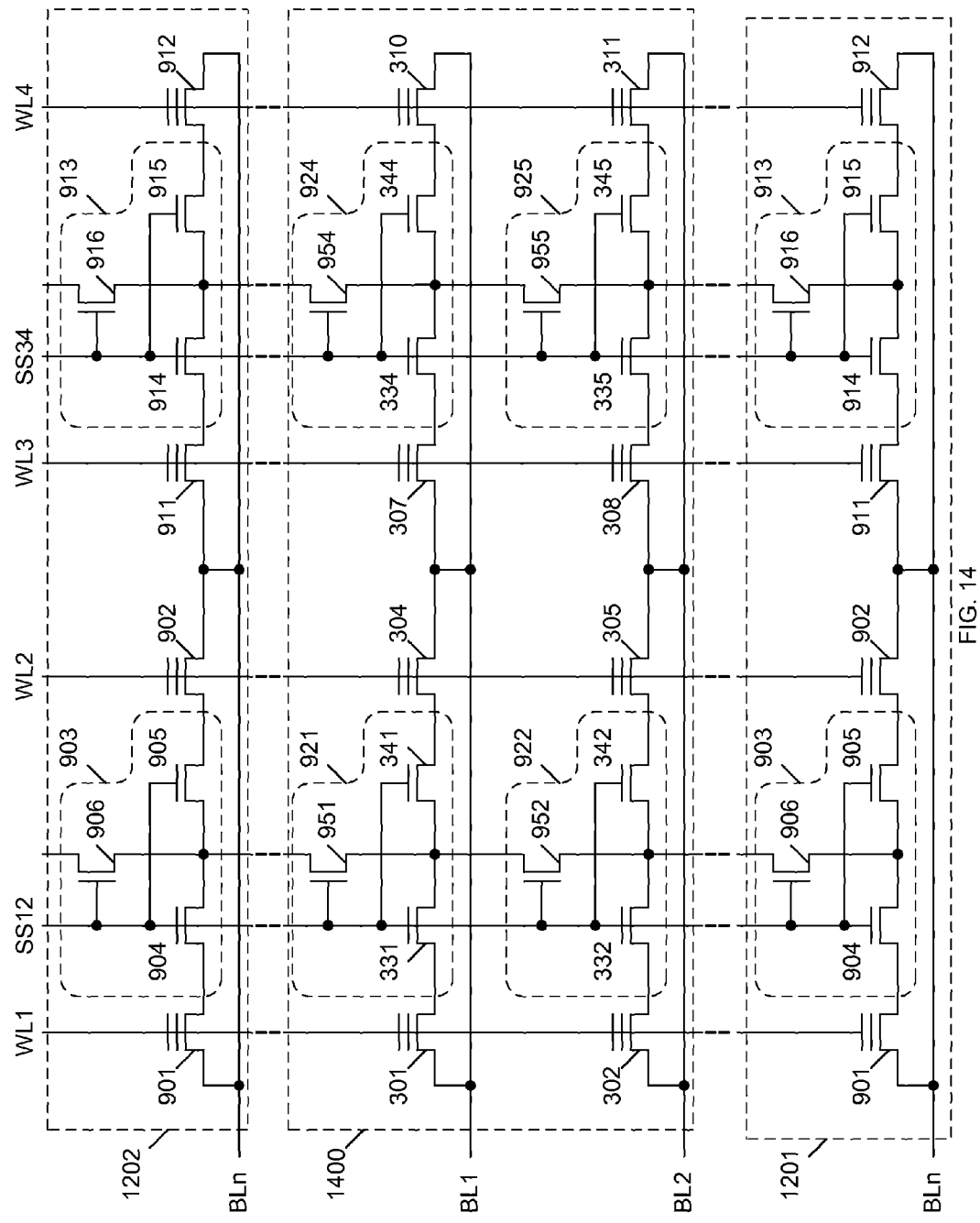
FIG. 14 is a circuit diagram illustrating a second source access column, which is added to the structure of FIG. 12 in accordance with one variation of the present invention.

FIG. 14 is a circuit diagram illustrating a second source access column 1202, which is located at the opposite end of an array 1400 (i.e., at the end opposite source access column 1201). Similar elements in source access columns 1201 and 1202 are labeled with similar reference numbers. Supplying read current from both ends of the array 1400 advantageously increases the allowable number of columns in array 1400. In one embodiment, there are sixteen columns between source access columns 1201 and 1202.

Although the present invention has been described in connection with particular embodiments, it is understood that variations in these embodiments would be apparent to one of ordinary skill in the art. Thus, the present invention is only limited by the following claims.

We claim:
1. A non-volatile memory array comprising:
one or more electrically erasable and programmable memory (EEPROM) cell pairs, each configured to store two data bits, and including:
a first non-volatile memory transistor having a floating gate structure separated from a control gate structure by an inter-gate dielectric layer;
a second non-volatile memory transistor having a floating gate structure separated from a control gate structure by an inter-gate dielectric layer; and
a source access transistor having a floating gate structure electrically connected with a control gate structure, the source access transistor located in a first well region and having a first diffusion region continuous with a source of the first non-volatile memory transistor, and having a second diffusion region continuous with a source of the second non-volatile memory transistor, wherein first well region is located in a second well region.
2. The non-volatile memory array of claim 1, further comprising a tunnel gate dielectric layer separating the floating gate structures of the first non-volatile memory transistor, the second non-volatile memory transistor and the source access transistor from the first well region.

3. The non-volatile memory array of claim 1, further comprising a bit line coupled to a drain of the first non-volatile memory transistor and a drain of the second non-volatile memory transistor.

4. The non-volatile memory array of claim 1, further comprising:
a first word line coupled to the control gate structure of the first non-volatile memory transistor; and
a second word line coupled to the control gate structure of the second non-volatile memory transistor; and
a source select line coupled to the control gate structure of the source access transistor.

5. The non-volatile memory array of claim 4, wherein the first word line, the second word line and the source select line extend in parallel along a first axis.

6. The non-volatile memory array of claim 1, wherein the only transistors in each EEPROM cell pair are the first non-volatile memory transistor, the second non-volatile memory transistor and the source access transistor.

7. A non-volatile memory array comprising:
one or more electrically erasable and programmable memory (EEPROM) cell pairs, each configured to store two data bits, and including:
a first non-volatile memory transistor having a floating gate structure separated from a control gate structure by an inter-gate dielectric layer;
a second non-volatile memory transistor having a floating gate structure separated from a control gate structure by an inter-gate dielectric layer; and
a source access transistor having a floating gate structure electrically connected with a control gate structure, the source access transistor located in a first well region and coupled to a source of the first non-volatile memory transistor and a source of the second non-volatile memory transistor, wherein first well region is located in a second well region,
wherein the one or more electrically erasable and programmable memory (EEPROM) cell pairs are arranged in a plurality of rows and columns, wherein a first one of said columns is configured such that the first non-volatile memory transistor and the second non-volatile memory transistor of each EEPROM cell pair in the first one of said columns are in a permanently conductive state.

8. The non-volatile memory array of claim 1, further comprising an inter-gate dielectric layer located between portions of the floating gate structure of the source access transistor and the control gate structure of the source access transistor.

9. The non-volatile memory array of claim 1, wherein the floating gate structure of the source access transistor is continuous along an entire row of the non-volatile memory array.

10. A non-volatile memory array comprising:
a first row comprising a first plurality of non-volatile memory transistors;
a second row comprising a second plurality of non-volatile memory transistors;
a plurality of source access transistors, each having a first diffusion region continuous with a source region of a corresponding one of the first plurality of non-volatile memory transistors in the first row, and each having a second diffusion region continuous with a source region of a corresponding one of the second plurality of non-volatile memory transistors in the second row, wherein the plurality of source access transistors comprise a floating gate structure and a control gate structure, wherein the floating gate structure is electrically connected to the control gate structure.

11. The non-volatile memory array of claim 10, wherein the floating gate structure is continuous along the plurality of source access transistors.

12. The non-volatile memory array of claim 10, further comprising an inter-gate dielectric layer located between portions of the floating gate structure and the control gate structure.

13. The non-volatile memory array of claim 10, wherein the first plurality of non-volatile memory transistors includes a first plurality of floating gate structures, and the second plurality of non-volatile memory transistors includes a second plurality of floating gate structures, wherein a tunnel gate dielectric layer is located below the floating gate structures of the first and second pluralities of non-volatile memory transistors and the floating gate structure of the source access transistors.

14. The non-volatile memory array of claim 10, wherein the plurality of source access transistors are located in a first well region, wherein the first well region is located in a second well region.

15. A non-volatile memory array comprising:
a first row comprising a first plurality of non-volatile memory transistors;
a second row comprising a second plurality of non-volatile memory transistors;
a plurality of source access transistors, each coupled to a source region of a corresponding one of the first plurality of non volatile memory transistors in the first row, and each coupled to a source region of a corresponding one of the second plurality of non-volatile memory transistors in the second row, wherein the plurality of source access transistors comprise a floating gate structure and a control gate structure, wherein the floating gate structure is electrically connected to the control gate structure, and wherein the first plurality of non-volatile memory transistors includes a first permanently conductive non-volatile memory transistor located at a first end of the first row.

16. The non-volatile memory array of claim 15, wherein the second plurality of non-volatile memory transistors includes a second permanently conductive non-volatile memory transistor located at a first end of the second row, adjacent to the first permanently conductive non-volatile memory transistor.

17. The non-volatile memory array of claim 15, wherein the first plurality of non-volatile memory transistors further includes a third permanently conductive non-volatile memory transistor located at a second end of the first row, and the second plurality of non-volatile memory transistors includes a fourth permanently conductive non-volatile memory transistor located at a second end of the second row, adjacent to the third permanently conductive non-volatile memory transistor.

* * * * *